(12) United States Patent
Akiyama

(10) Patent No.: US 7,485,943 B2
(45) Date of Patent: Feb. 3, 2009

(54) DIELECTRIC ISOLATION TYPE SEMICONDUCTOR DEVICE AND MANUFACTURING METHOD THEREFOR

(75) Inventor: Hajime Akiyama, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 277 days.

(21) Appl. No.: 11/408,087

(22) Filed: Apr. 21, 2006

(65) Prior Publication Data

US 2006/0249807 A1  Nov. 9, 2006

(30) Foreign Application Priority Data

May 9, 2005 (JP) ............................. 2005-135967

(51) Int. Cl.
*H01L 29/00* (2006.01)
*H01L 27/01* (2006.01)

(52) U.S. Cl. .................. 257/509; 257/347; 257/506; 257/510; 438/353; 438/359

(58) Field of Classification Search ......... 257/347–354, 257/372–374, 499, 506, 509–513; 438/353–364
See application file for complete search history.

(56) References Cited

U.S. PATENT DOCUMENTS

| 6,992,363 | B2 | 1/2006 | Akiyama et al. | |
| 7,125,780 | B2* | 10/2006 | Akiyama et al. | 438/359 |
| 7,135,752 | B2* | 11/2006 | Akiyama et al. | 257/501 |
| 2004/0155573 | A1* | 8/2004 | Horiuchi et al. | 313/499 |
| 2005/0127470 | A1* | 6/2005 | Akiyama et al. | 257/506 |

FOREIGN PATENT DOCUMENTS

| CN | 1508840 A | 6/2004 |
| DE | 10 2004 059 629 A1 | 7/2005 |
| JP | 6-216113 | 8/1994 |
| JP | 9-45762 | 2/1997 |
| JP | 3435930 | 6/2003 |

OTHER PUBLICATIONS

Kazuo Imai, "A New Dielectric Isolation Method Using Porous Silicon", Solid-State Electronics, vol. 24, 1988, pp. 159-161 and 163-164.

* cited by examiner

*Primary Examiner*—Zandra Smith
*Assistant Examiner*—Telly D Green
(74) *Attorney, Agent, or Firm*—Oblon, Spivak, McClelland, Maier & Neustadt, P.C.

(57) ABSTRACT

A dielectric isolation type semiconductor device includes a dielectric isolation type substrate in which a support substrate, an embedded dielectric layer, and a first conductive type semiconductor substrate of a low impurity concentration are laminated one over another. The semiconductor substrate includes a first semiconductor region of a first conductive type having a high impurity concentration, a second semiconductor region of a second conductive type having a high impurity concentration arranged so as to surround the first semiconductor region, a first main electrode joined to a surface of the first semiconductor region, and a second main electrode joined to a surface of the second semiconductor region. A first dielectric portion is arranged adjacent the embedded dielectric layer so as to surround a region of the support substrate superposed on the first semiconductor region in a direction of lamination thereof, and a wire connected with the first main electrode.

3 Claims, 11 Drawing Sheets

DIELECTRIC ISOLATION TYPE SEMICONDUCTOR DEVICE AND MANUFACTURING METHOD THEREFOR

BACKGROUND OF THE INVENTION

1. Field of the Invention

The present invention relates to a dielectric isolation type semiconductor device with a high voltage circuit formed on a dielectric isolation type substrate, and to a manufacturing method therefor.

2. Description of the Related Art

In a known dielectric isolation semiconductor device, a dielectric layer and a rear surface electrode are arranged on an upper surface and a lower surface, respectively, of a support substrate, and a semiconductor substrate is provided on an upper surface of the dielectric layer so that the semiconductor substrate and the support substrate are dielectrically isolated from each other by means of the dielectric layer. An insulating film in the semiconductor substrate serves to define, in a prescribed range, an n− type semiconductor layer that constitutes the semiconductor substrate, and in this defined prescribed range, an n+ type semiconductor region having a resistance lower than that of the n− type semiconductor layer is formed on an upper surface of the n− type semiconductor layer, and a p+ type semiconductor region is also formed so as to surround the n+ type semiconductor region. In addition, a cathode electrode and an anode electrode are connected with the n+ type semiconductor region and the p+ type semiconductor region, respectively, and the cathode electrode and the anode electrode are insulated from each other by a field oxide film.

When both the anode electrode and the rear surface electrode are set to 0V with a positive voltage applied on the cathode electrode being gradually increased, there will develop a first depletion layer extending from a p-n junction between the n− type semiconductor layer and the p+ type semiconductor region. At this time, since the semiconductor substrate acts as a field plate through the dielectric layer, a second depletion layer in addition to the first depletion layer develops so as to extend in a direction toward the upper surface of the n− type semiconductor layer from an interface or boundary surface of the n− type semiconductor layer and the dielectric layer. Due to the extension of the second depletion layer, the first depletion layer become able to easily extend from the p-n junction toward the cathode electrode whereby an electric field at the p-n junction between the n− type semiconductor layer and the p+ type semiconductor region is alleviated. This effect is generally called a RESURF (reduced surface field) effect.

The electric field strength in the thickness direction of the n− type semiconductor layer at a position sufficiently away from the p+ type semiconductor region is zero in a range from an upper surface of the n− type semiconductor layer up to a prescribed position, increases linearly from the prescribed position, further increases in a stepwise manner at the interface or boundary surface of the n− type semiconductor layer and the dielectric layer, becomes constant in the dielectric layer, and returns to zero at a boundary between the dielectric layer and the support substrate. Representing the thickness of the depletion layer extending from the boundary between the n− type semiconductor layer and the dielectric layer by x, the thickness of the dielectric layer by $t_0$, the impurity concentration of the n− type semiconductor layer by $N(cm^{-3})$, the dielectric constant of a vacuum by $\varepsilon_0$ $(C \times V^{-1} \times cm^{-1})$, the relative dielectric constant of the n− type semiconductor layer by $\varepsilon_2$, and the relative dielectric constant of the dielectric layer by $\varepsilon_3$, respectively, a full voltage drop V in the thickness direction of the n− type semiconductor layer at a position sufficiently away from the p+ type semiconductor region is represented by the following expression (1).

$$V = q \cdot N/(\varepsilon_2 \cdot \varepsilon_0) \times (x^2/2 + \varepsilon_2 \cdot t_0 x/\varepsilon_3) \qquad (1)$$

From expression (1) above, it is found that when the thickness $t_0$ of the dielectric layer is increased while keeping the full voltage drop V unchanged, the thickness x of the second depletion layer extending from the interface is decreased. This means the RESURF effect becomes weaker.

On the other hand, under the condition that avalanche breakdowns due to the concentration of electric field at the p-n junction between the n− type semiconductor layer and the p+ type semiconductor region and the concentration of electric field at the interface between the n− type semiconductor layer and the n+ type semiconductor region do not occur, the dielectric strength of the dielectric isolation type semiconductor device is eventually determined by the avalanche breakdown due to the concentration of electric field at the interface between the n− type semiconductor layer and the dielectric layer at a location right under the n+ type semiconductor region. In order to construct the dielectric isolation type semiconductor device so as to satisfy such a condition, the p+ type semiconductor region and the n+ type semiconductor region need only be arranged sufficiently away from each other so that the thickness and the impurity concentration of the n− type semiconductor layer can be optimized.

It is generally known that the condition for nonoccurrence of avalanche breakdowns means that state in which when depletion is caused from the interface between the n− type semiconductor layer and the dielectric layer to the upper surface of the n− type semiconductor layer, the concentration of electric field at the interface between the n− type semiconductor layer and the dielectric layer satisfies the avalanche breakdown condition.

Under such a condition, when the thickness of the n− type semiconductor layer is represented by d and the critical electric field that causes avalanche breakdown by $E_{cr}$, the dielectric strength V is shown by the following expression (2), while neglecting the thickness of the n+ type semiconductor region.

$$V = E_{cr} \cdot (d/2 + \varepsilon_2 \cdot t_0/\varepsilon_3) \qquad (2)$$

Here, the dielectric strength V of the dielectric isolation type semiconductor device is calculated with the n− type semiconductor layer being formed of silicon, and the dielectric layer being formed of a silicon oxide film. $D = 4 \times 10^{-4}$ and $t_0 = 2 \times 10^{-4}$ are adopted as general values for the distance d and the thickness $t_0$, respectively. The critical electric field strength $E_{cr}$, though influenced by the thickness d of the n− type semiconductor layer, is represented in this case by about $E_{cr} = 4 \times 10^5$. With this, by assigning numeric values 11.7 and 3.9 to $\varepsilon_2$ and $\varepsilon_3$ (i.e., $\varepsilon_2 = 11.7$ and $\varepsilon_3 = 3.9$), respectively, the dielectric strength V is calculated as 320 V.

When the thickness d of the n− type semiconductor layer is increased by 1 μm, the dielectric strength increases by 20 V, and when the thickness $t_0$ of the dielectric layer is increased by 1 μm, the dielectric strength increases by 120 V.

Thus, the dielectric strength increases more greatly when increasing the thickness of the dielectric layer than when increasing the thickness of the n− type semiconductor layer, so for the purpose of increasing of the dielectric strength, it is more effective to increase the thickness of the dielectric layer rather than that of the n− type semiconductor layer. Besides, to increase the thickness of the n− type semiconductor layer results in increased difficulty in the formation of the insulating film, and hence is undesirable.

On the other hand, when the thickness of the dielectric layer is increased, the extension of the second depletion layer becomes small as stated above, thus resulting in reduction in the RESURF effect. That is, the concentration of electric field at the p-n junction between the p+ type semiconductor region and the n− type semiconductor layer increases, whereby the dielectric strength will be limited by a possible avalanche breakdown at this p-n junction.

Accordingly, by forming a porous oxide film in a region of the support substrate including a portion right under the cathode electrode arranged on the upper surface of the n+ type semiconductor region of the semiconductor substrate, the concentration of electric field in the n− type semiconductor layer in the vicinity of the boundary of the n+ type semiconductor region and the n− type semiconductor layer is alleviated, and the dielectric strength is improved.

In addition, by forming a through hole in a region of the support substrate including a portion right under a drain electrode of a MOSFET formed on the semiconductor substrate, and forming a dielectric layer made of silicone ladder polymer on that portion of the dielectric layer which appears in the interior of the through hole, the concentration of electric field in the n− type semiconductor layer in the vicinity of the boundary of the n+ type semiconductor region and the n− type semiconductor layer is alleviated, and the dielectric strength is improved (see, for example, a first patent document: Japanese patent application laid-open No. 2004-200472).

However, when the dielectric strength of the dielectric isolation type semiconductor device increases due to the formation of the porous oxide film, the dielectric strength of lead-out wiring from the cathode electrode will fall below the dielectric strength of the dielectric isolation type semiconductor device. In view of this, by adopting wire wiring in place of the lead-out wiring from the cathode electrode, the dielectric strength can be made to exceed the dielectric strength of the semiconductor device.

However, when a wire is wire bonded to the cathode electrode right under which the porous oxide film is formed, by using an ultrasonic wire bonder, there will be a problem that an ultrasonic wave is applied to the sponge-like porous oxide film, thereby generating a crack therein.

Moreover, in the case where the through hole is formed through the support substrate, there is another problem that the dielectric isolation type semiconductor device might be caused to flex due to a force that is generated by a header of the ultrasonic wire bonder to urge the wire against the drain electrode.

SUMMARY OF THE INVENTION

Accordingly, the object of the present invention is to provide a dielectric isolation type semiconductor device and a manufacturing method therefor in which the dielectric strength of the device can be maintained and at the same time wiring from an electrode is made by wire wiring of a high dielectric strength.

A dielectric isolation type semiconductor device according to the present invention includes a dielectric isolation type substrate which is composed of: a support substrate; an embedded dielectric layer formed on an entire area of a first principal plane of the support substrate; and a semiconductor substrate of a first conductive type having a low impurity concentration being laminated on the support substrate through the embedded dielectric layer. The semiconductor substrate includes: a first semiconductor region of a first conductive type having a high impurity concentration that is selectively formed; a second semiconductor region of a second conductive type having a high impurity concentration that is arranged so as to surround the first semiconductor region in a manner spaced a predetermined distance from an outer peripheral edge thereof; a first main electrode that is joined to a surface of the first semiconductor region; and a second main electrode that is joined to a surface of the second semiconductor region. The dielectric isolation type semiconductor device includes: a first dielectric portion that is arranged adjacent to the embedded dielectric layer in a manner so as to surround a region of the support substrate that is superposed on the first semiconductor region in a direction of lamination thereof; and a wire that is connected with the first main electrode.

The advantageous effects of the dielectric isolation type semiconductor device according to the present invention are as follows. That is, the first dielectric portion that surrounds a region of the support substrate located right under the first semiconductor region is arranged in the support substrate so as to be in contact with the embedded dielectric layer, so the dielectric strength of the dielectric isolation type semiconductor device can be maintained high.

In addition, when a wire is bonded to the first main electrode by using an ultrasonic wire bonder, ultrasonic vibration applied from a head of the wire bonder to the first main electrode through the wire is propagated to the support substrate while passing through the N-well region, but the support substrate to be affected by the ultrasonic vibration thus propagated is made of a single-crystal silicon with a high mechanical strength, and hence is not subjected to mechanical defects such as cracks or the like due to the ultrasonic vibration. Thus, the wire can be bonded by means of the ultrasonic wire bonder, so wiring from the first main electrode can be made with the use of the wire that has a large dielectric strength.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described below while referring to the accompaniment drawings.

Embodiment 1

Figure 1:
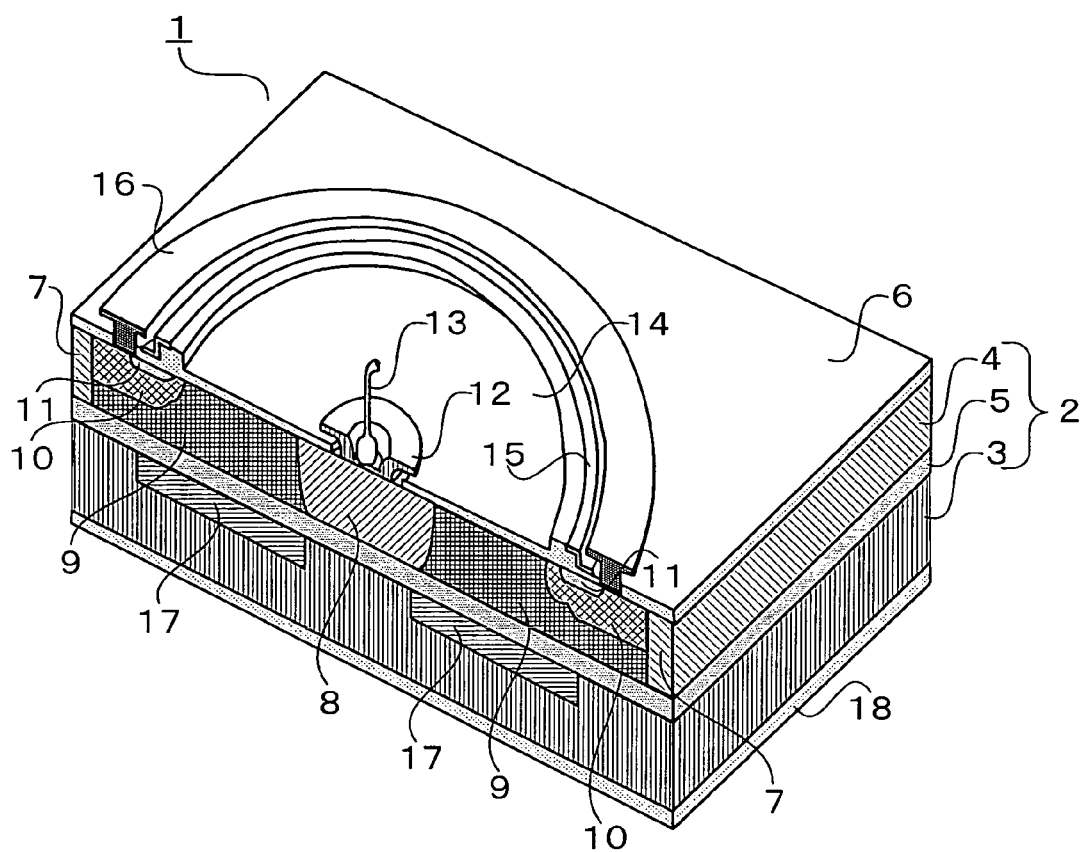
FIG. 1 is a perspective view, including a partial cross section, of a dielectric isolation type semiconductor device according to a first embodiment of the present invention.
Figure 2:
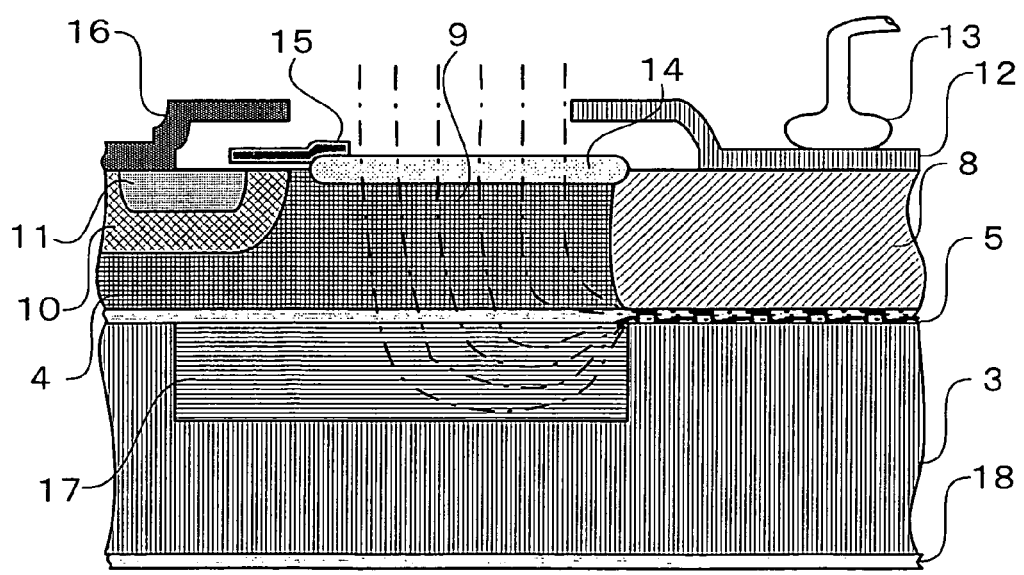
FIG. 2 is a cross sectional view showing electric flux when a voltage is impressed to the dielectric isolation type semiconductor device according to the first embodiment.

FIG. 1 is a perspective view, including a partial cross section, of a dielectric isolation type semiconductor device according to a first embodiment of the present invention. FIG. 2 is a cross sectional view that shows electric flux when a voltage is impressed to the dielectric isolation type semiconductor device according to the first embodiment.

The dielectric isolation type semiconductor device, generally designated at reference numeral 1, according to the first embodiment of the present invention is formed on a dielectric isolation type substrate 2 of an SOI (Silicon On Insulator) structure, as shown in FIG. 1. The dielectric isolation type substrate 2 is constructed, as an integral body, of a support substrate 3 made of silicon, a semiconductor substrate 4 made of silicon with a high voltage circuit being formed thereon, and an embedded oxide film 5 in the form of an embedded dielectric layer that is arranged adjacent a first principal plane of the support substrate 3.

On the semiconductor substrate 4, there is formed a MOSFET in the form of one example of an integrated circuit of high dielectric resistance, and the semiconductor substrate 4 is composed of an n type silicon layer 6 of a first conductive type with a low impurity concentration.

The n type silicon layer 6 is divided into a prescribed range thereof by an insulating film 7 in a ring-shaped fashion. An N-well region 8 in the form of a first semiconductor region of a first conductive type having high impurity concentration is formed in the central portion of the prescribed divided range over an area extending from an upper surface of the n type silicon layer 6, i.e., its one surface opposite to its other surface in contact with the embedded oxide film 5 to the embedded oxide film 5, while leaving an annular portion of the n type silicon layer 6 of a predetermined width around the N-well region 8 in a surface direction of the n type silicon layer 6. This annular portion of the n type silicon layer 6 is referred to as an n− region 9. A P-well region 10 in the form of an annular second semiconductor region of a second conductive type having a predetermined width and high impurity concentration is formed around the n− region 9 so as to extend from the upper surface of the n type silicon layer 6 to a predetermined depth in a thickness direction thereof. Further, an n+ region 11 of the first conductive type having high impurity concentration, being contained in the P-well region 10, is formed so as to extend from the upper surface of the n type silicon layer 6 up to a depth that is shallower than the P-well region 10.

In addition, a drain electrode 12 in the form of a first main electrode is formed on a surface of the N-well region 8 corresponding to the upper surface of the n type silicon layer 6, and a wire 13 is connected with the drain electrode 12.

A field insulating film 14 is formed on an upper surface of the n− region 9, and a gate electrode 15 is in turn formed on a surface of the field insulating film 14.

A source electrode 16 in the form of a second main electrode is formed on a surface of the P-well region 10 corresponding to the upper surface of the n type silicon layer 6.

On the other hand, a porous oxide film 17 in the form of a first dielectric portion is formed in an annular region of the support substrate 3 extending from an outer periphery of a region, which superposes on the N-well region 8 when the n type silicon layer 6 with the MOSFET formed thereon is projected on the support substrate 3, to a part of the P-well region 10 over a predetermined depth from the embedded oxide film 5.

Moreover, a rear surface electrode 18 is formed on a rear surface of the support substrate 3, i.e., its one surface opposite to its other surface in contact with the embedded oxide film 5.

Next, reference will be made to a method of manufacturing a dielectric isolation type semiconductor device 2 according to the first embodiment of the present invention. In the manufacture of this dielectric isolation type substrate 2, when the semiconductor substrate 4 is superposed beforehand on the support substrate 3 to form a MOSFET circuit, the porous oxide film 17 of a predetermined pattern is formed on a lower portion of the N-well region 8 while leaving a single-crystal silicon as it is. The single-crystal silicon substrate, which is a starting material of the support substrate 3, is masked except for a portion thereof in which the porous oxide film 17 is to be formed, and then is soaked in a hydrofluoric acid solution in a chemical conversion tank, which is composed of hydrofluoric acid dissolved in a solvent such as ethyl alcohol for instance. Thereafter, the single-crystal silicon substrate is subjected to anodizing processing by applying a positive electric potential to the single-crystal silicon substrate, and a negative potential to a platinum electrode soaked in the solution. With the anodizing processing, the silicon is dissolved to form a porous silicon layer. After removing the masking, the porous silicon layer is preliminarily oxidized. Thereafter, by thermally oxidizing the single-crystal silicon substrate in the form of the semiconductor substrate 4, a thermal oxide film is formed in the peripheral portion of the single-crystal silicon substrate, which is then laminated with the support substrate 3 having the porous oxide film formed thereon, and is integrated therewith by being subjected to a heat treatment. After that, the semiconductor substrate 4 is decreased in thickness to provide the dielectric isolation type substrate 2. The thermal oxide film formed on the peripheral portion of the semiconductor substrate 4 remains between the support substrates 3 and the semiconductor substrate 4 to become the embedded oxide film 5, by which the circuits formed on the semiconductor substrate 4 are dielectrically isolated.

In such a dielectric isolation type semiconductor device 1 according to the first embodiment, when 0 V is impressed to the source electrode 16 and the rear surface electrode 18, with a positive voltage being impressed to the drain electrode 12, the lines of electric flux between the drain electrode 12 and the source electrode 16, and between the drain electrode 12 and the rear surface electrode 18 are drawn, as shown in FIG. 2. The N-well region 8 reaches the embedded oxide film 5, so the electric flux lines pass from the n– region 9 to the n– region 9 through the embedded oxide film 5. Here, when seeing the interior of the n– region 9 in which a critical electric field strength that causes avalanche breakdown is low becomes a problem, a part of the electric flux passes in the porous oxide film 17, so in the n– region 9 in the vicinity of a boundary between the N-well region 8 and the n– region 9, the electric field strength does not increase even in comparison with the case in which the porous oxide film 17 is arranged on the support substrate 3 at a location right under the N-well region 8.

Also, in the dielectric isolation type semiconductor device 1, the porous oxide film 17 surrounding a region of the support substrate 3 located right under the N-well region 8 is arranged in the support substrate 3 so as to be in contact with the embedded oxide film 5, whereby the dielectric strength of the dielectric isolation type semiconductor device 1 can be maintained high.

In addition, when the wire 13 is bonded to the drain electrode 12 by using an ultrasonic wire bonder, ultrasonic vibration applied from a head of the wire bonder to the drain electrode 12 through the wire 13 is propagated to the support substrate 3 while passing through the N-well region 8, but the support substrate 3 to be affected by the ultrasonic vibration thus propagated is made of the single-crystal silicon with a high mechanical strength, and hence is not subjected to mechanical defects such as cracks or the like due to the ultrasonic vibration. Thus, the wire 13 can be bonded by means of the ultrasonic wire bonder, so wiring from the drain electrode 12 can be made with the use of the wire 13 that has a large dielectric strength.

Embodiment 2

Figure 3:
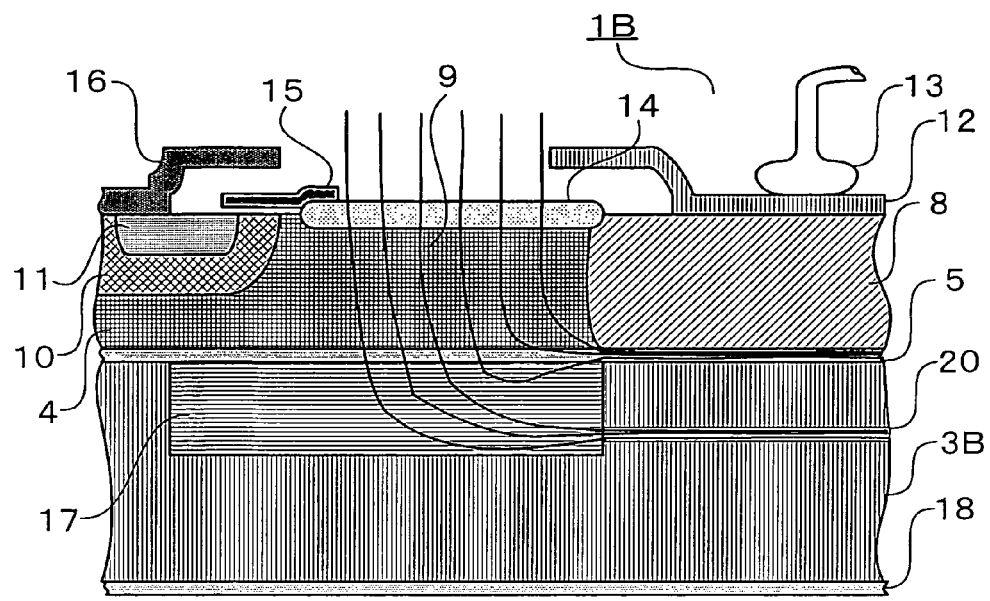
FIG. 3 is a partial cross sectional view of a dielectric isolation type semiconductor device according to a second embodiment of the present invention.

FIG. 3 is a partial cross sectional view of a dielectric isolation type semiconductor device according to a second embodiment of the present invention. The dielectric isolation type semiconductor device, generally designated at 1B, according to the second embodiment is different from the above-mentioned dielectric isolation type semiconductor device 1 according to the first embodiment in that a second embedded oxide film 20 in the form of a first dielectric layer is added to a support substrate 3B, as shown in FIG. 3, but the other construction of this embodiment is similar to the first embodiment, and hence like components or parts are identified by like symbols while omitting a detailed explanation thereof.

This second embedded oxide film 20 is formed beforehand in the process of preparing a dielectric isolation type substrate 2. Specifically, the second embedded oxide film 20 is formed by injecting oxygen ions into a single-crystal silicon substrate in the form of a starting material of the support substrate 3B in a manner so as to stay in a prescribed position, and applying high-temperature annealing to the single-crystal silicon substrate thus injected with the oxygen ions. The depth of the single-crystal silicon substrate at which the oxygen ions stay is within the depth of the porous oxide film 17. Thereafter, the porous oxide film 17 is formed in a manner similar to the first embodiment, and the preparation of the support substrate 3B is completed. Then, the support substrate 3B thus prepared and the semiconductor substrate 4 with the thermal oxide film formed over its entire peripheral portion are integrated with each other.

The second embedded oxide film 20 is formed at a location within the depth of the porous oxide film 17, so when 0 V is impressed to the source electrode 16 and the rear surface electrode 18, with a positive voltage being impressed to the drain electrode 12, the lines of electric flux between the drain electrode 12 and the source electrode 16, and between the drain electrode 12 and the rear surface electrode 18 are drawn, as shown in FIG. 3. The N-well region 8 reaches the embedded oxide film 5, so a part of the electric flux lines pass from the n– region 9 to the n– region 9 through the embedded oxide film 5, whereas the remaining part of the electric flux lines extends from the n– region 9 to the n– region 9 through the embedded oxide film 5, the porous oxide film 17, the second embedded oxide film 20, the porous oxide film 17, and the embedded oxide film 5.

In such a dielectric isolation type semiconductor device 1B, the two embedded oxide films 5, 20 are formed in the support substrate 3B at locations right under the N-well region 8, so that the electric field is allotted by the embedded oxide films 5, 20. With such an arrangement, the electric field strength of the n– region 9 in the vicinity of the boundary of the N-well region 8 and the n– region 9 is alleviated or reduced, so it is possible to form a semiconductor circuit of higher dielectric strength on the semiconductor substrate 4.

Although in the second embodiment, oxygen ions are injected before the porous oxide film 17 is formed in the support substrate 3B, the injection of oxygen ions may be made before bonding in case where high energy selectivity can be ensured.

Embodiment 3

Figure 4:
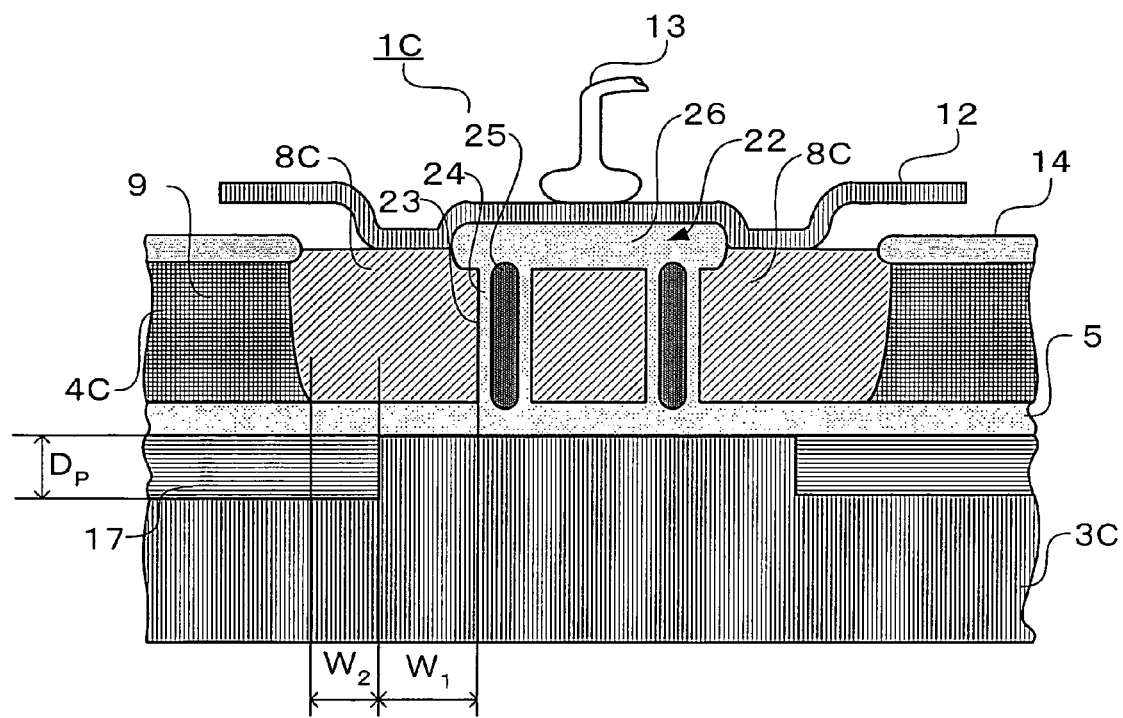
FIG. 4 is a cross sectional view of a dielectric isolation type semiconductor device according to a third embodiment of the present invention.

FIG. 4 is a cross sectional view of a dielectric isolation type semiconductor device according to a third embodiment of the present invention. The dielectric isolation type semiconductor device, generally designated at 1C, according to the third embodiment is different from that of the first embodiment in the configuration of an N-well region 8C, but the other construction of this embodiment is similar to the first embodiment, and hence like components or parts are identified by like symbols while omitting a detailed explanation thereof.

The N-well region 8C is formed in its interior with a trench isolation region 22. The trench isolation region 22 includes a side wall oxide film 24 on a side wall of a trench groove 23, a polysilicon 25 that fills the trench groove 23 having the side wall oxide film 24 formed thereon, and a field oxide film 26 that covers the trench groove 23 filled with the polysilicon 25.

The shortest distance or width $W_1$ between the outer side wall of the trench groove 23 and the porous oxide film 17 is greater than the thickness $D_P$ of the porous oxide film 17.

In addition, the N-well region 8C and the porous oxide film 17 are arranged in a manner so as to overlap with each other by a width $W_2$ that is substantially equal to the width $W_1$.

Next, reference will be made to the formation of the trench isolation region 22. First, the N-well region 8C is formed by diffusing an impurity that exhibits the first conductive type to the semiconductor substrate 4C of the dielectric isolation type substrate 2 from its upper surface side at a high concentration so as to reach the embedded oxide film 5. Then, the semiconductor substrate 4C is trench etched by dry etching until the embedded oxide film 5 of the semiconductor substrate 4C is exposed, whereby the trench groove 23 is formed. Subsequently, the side wall oxide film 24 is formed on the trench side wall of the trench groove 23 by means of vapor deposition or thermal oxidation, after which polysilicon is vapor deposited so as to fill in the trench groove 23. Thereafter, the polysilicon deposited on portions other than the trench groove 23 is removed by etching back. Finally, the trench isolation region 22 and a part of the N-well region 8C lying in the vicinity thereof are covered with the field oxide film 26, and the drain electrode 12 is formed which covers the field oxide film 26 and the N-well region 8C.

Thus, the wire 13 is wire bonded to the drain electrode 12 with the trench isolation region 22 formed in a lower portion thereof by means of an ultrasonic wire bonder.

In such a dielectric isolation type semiconductor device 1C, the trench isolation region 22, the rigidity of which is increased by the side wall oxide film 24, is formed in the lower portion of the drain electrode 12 to which the wire 13 is wire bonded, so the bonding strength of the wire 13 to the drain electrode 12 is improved.

In addition, the shortest distance $W_1$ between the trench isolation region 22 and the porous oxide film 17 is greater than the thickness $D_P$ of the porous oxide film 17, so even if ultrasonic vibration is propagated to below a lower portion of the trench isolation region 22, it is possible to prevent the ultrasonic vibration or wave from being irradiated to the porous oxide film 17 since the porous oxide film 17 is retreated to the outside at an angle of 45 degrees or more. Therefore, there will never be induced any mechanical defect such as a crack, etc., in the porous oxide film 17.

Moreover, since the porous oxide film 17 and the N-well region 8C are superposed or overlapped with each other by the width $W_2$ similar to the width $W_1$, so upon impression of a voltage, the strength of electric field in the n– region 9 in the vicinity of a treble point of the N-well region 8C, the n– region 9 and the embedded oxide film 5 is reduced to below a critical electric field strength for avalanche breakdown.

In the third embodiment, the trench groove 23 in the trench isolation region 22 is one or a single structure, but the trench isolation region 22 is formed in a self-completed manner, so the trench groove 23 may be formed in a multiple structure.

Embodiment 4

Figure 5:
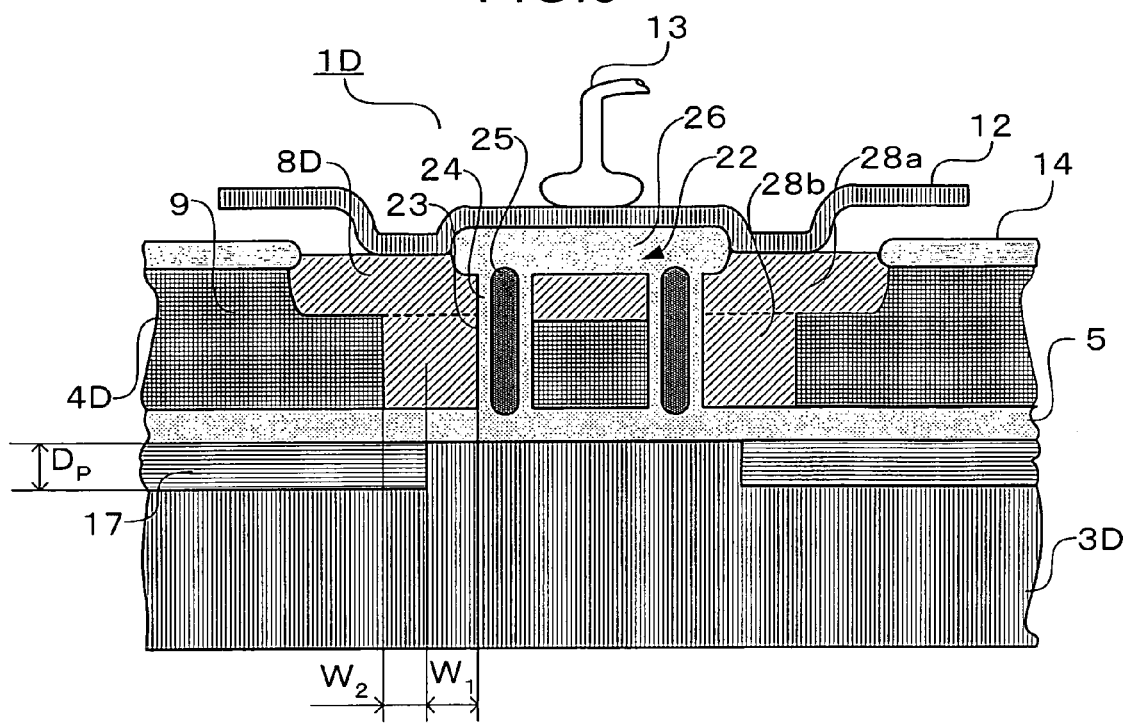
FIG. 5 is a cross sectional view of a dielectric isolation type semiconductor device according to a fourth embodiment of the present invention.

FIG. 5 is a cross sectional view of a dielectric isolation type semiconductor device according to a fourth embodiment of the present invention. The dielectric isolation type semiconductor device, generally designated at 1D, according to the fourth embodiment is different from the dielectric isolation type semiconductor device 1C according to the third embodiment in the provision of an N-well region 8D, shown in FIG. 5, but the other construction of this embodiment is similar to the fourth embodiment, and hence like components or parts are identified by like symbols while omitting a detailed explanation thereof.

The N-well region 8D includes a first N-well region 28a that is formed by diffusing an impurity of the first conductive type to the upper surface of the n type silicon layer 6 from above at a high concentration, and a second N-well region 28b in the form of a third semiconductor region that is formed by diffusing an impurity of the first conductive type to the trench groove 23 from the trench side wall at a high concentration.

The shortest distance or width $W_1$ between the outer side wall of the trench groove 23 and the porous oxide film 17 is greater than the thickness $D_P$ of the porous oxide film 17.

In addition, the second N-well region 28b and the porous oxide film 17 are arranged in a manner so as to overlap with each other by the predetermined width $W_2$.

The N-well region 8D is formed as follows. That is, the semiconductor substrate 4D is trench etched by dry etching until the embedded oxide film 5 of the semiconductor substrate 4D is exposed, whereby the trench groove 23 is formed. Then, the first N-well region 28a is formed by diffusing an impurity that exhibits the first conductive type to the semiconductor substrate 4D of the dielectric isolation type substrate 2 from its upper surface side at a high concentration. Thereafter, the N-well region 28b is formed by diffusing an impurity that exhibits the first conductive type from the side wall of the trench groove 23 at a high concentration. Subsequently, the side wall oxide film 24 is formed on the trench side wall of the trench groove 23 by means of vapor deposition or thermal oxidation, after which polysilicon is vapor deposited so as to fill in the trench groove 23. Thereafter, the polysilicon deposited on portions other than the trench groove 23 is removed by etching back. Finally, the trench isolation region 22 and a part of the first and second N-well regions 28a, 28b lying in the vicinity thereof are covered with the field oxide film 26, and the drain electrode 12 is formed which covers the field oxide film 26 and the first N-well region 28a.

In such a dielectric isolation type semiconductor device 1D, the impurity in the second N-well region 28b right under the drain electrode 12 is able to diffuse at a high concentration, so the on-resistance of a MOSFET formed on the semiconductor substrate 4D can be reduced.

Although in this fourth embodiment, the first conductive type impurity is diffused to a region of the semiconductor substrate 4D surrounded by the trench isolation region 22 at a high density, there will be no influence on the characteristic of dielectric isolation type semiconductor device 1D even if such diffusion of the first conductive type impurity to this region is not carried out.

Embodiment 5

Figure 6:
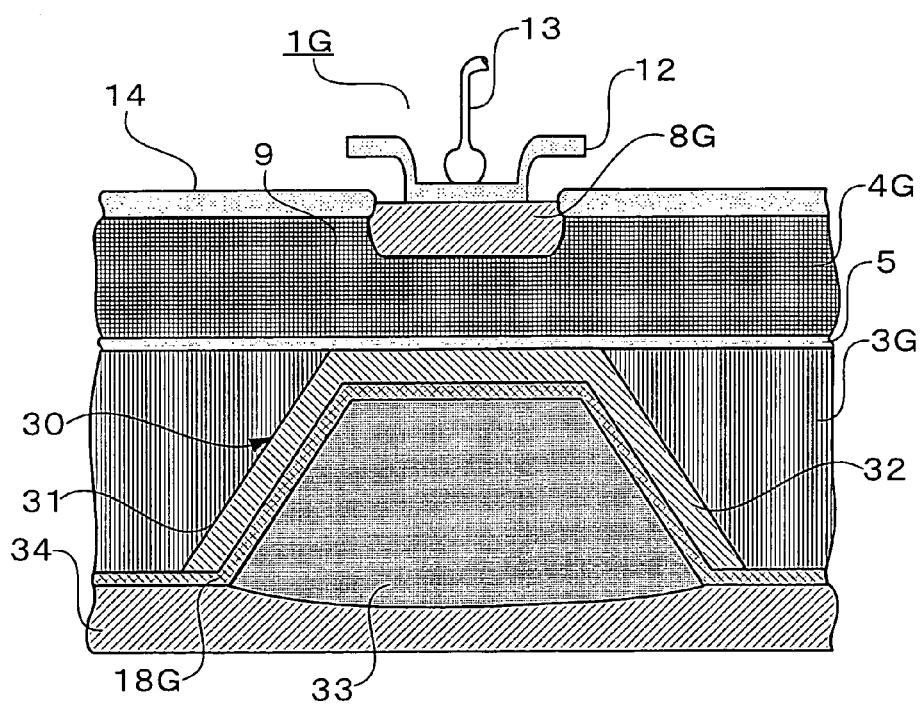
FIG. 6 is a cross sectional view of a dielectric isolation type semiconductor device according to a fifth embodiment of the present invention.
Figure 7:
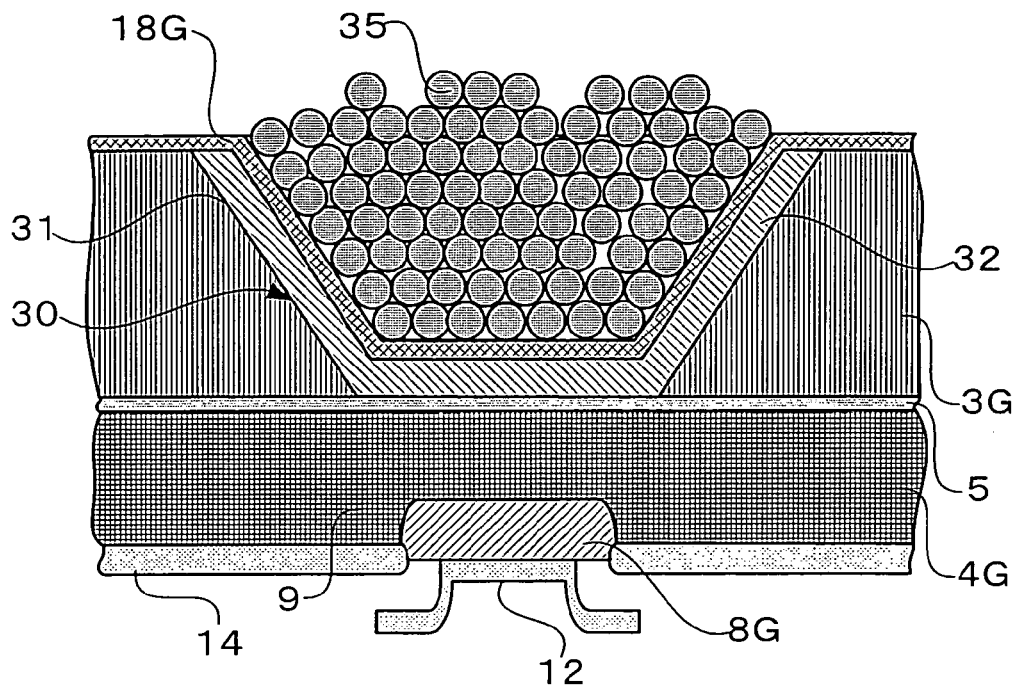
FIG. 7 is a view showing how to fill a ball solder into a through hole according to the fifth embodiment of the present invention.

FIG. 6 is a cross sectional view of a dielectric isolation type semiconductor device according to a fifth embodiment of the present invention, and FIG. 7 is a view showing how to fill a ball solder into a through hole according to the fifth embodiment of the present invention. The dielectric isolation type semiconductor device, generally designated at 1G, according to the fifth embodiment is different from the above-mentioned dielectric isolation type semiconductor device 1 according to the first embodiment in a support substrate 3G and an N-well region 8G formed in a semiconductor substrate 4G, as shown in FIG. 6, but the other construction of this fifth embodiment is similar to the first embodiment, and hence like components or parts are identified by like symbols while omitting a detailed explanation thereof. In the N-well region 8 of the first embodiment, the first conductive type impurity is diffused from the upper surface of the n type silicon layer 6 over the embedded oxide film 5, but in the N-well region 8G of the fifth embodiment, an impurity of the first conductive type is diffused from the upper surface of the n type silicon layer 6 up to a predetermined depth.

On the other hand, in the support substrate 3G, a through hole 30 is formed through the support substrate 3G at a location right under the N-well region 8G. The through hole 30 is of a truncated quadrangular pyramid with one opening thereof in its rear surface being wider than the other opening facing the embedded oxide film 5, and is formed so as to reach the embedded oxide film 5. A silicone ladder polymer layer 32 in the form of a second dielectric portion is arranged adjacent to the other opening of the through hole 30 facing the embedded oxide film 5 and a side wall 31 of the through hole 30, and a rear surface electrode 18G is formed on a rear surface of the support substrate 3G and a surface of the silicone ladder polymer layer 32. The through hole 30 with the rear surface electrode 18G formed therein is filled with a first solder 33, and the rear surface electrode 18G and the first solder 33 are both covered with a second solder 34.

Next, reference will be made to a process of forming the through hole 30 in the support substrate 3G, and filling it with the two kinds of solders 33, 34.

The through hole 30 is formed by performing anisotropic wet etching on the rear surface of the support substrate 3G of the dielectric isolation type substrate 2, which has a MOSFET formed on the semiconductor substrate 4G, until the embedded oxide film 5 appears by using an alkaline solution such as potassium hydroxide. Here, the side wall 31 of the through hole 30 has an inclination or slope of about 57 degrees with respect to the rear surface of the support substrate 3G.

Then, in order to improve the bonding strength to the silicone ladder polymer, the surfaces of the silicon and the silicon oxide are primed by a primer liquid that is prepared by adding a silane coupling agent of a few % to an isopropyl alcohol solution.

Thereafter, silicone polymer of a weight-average molecular weight of 150 k (resin A) is dissolved in anisole solvents so as to prepare a first varnish with a 10% by weight solid component dissolved therein, and a second varnish with a 15% by weight solid component dissolved therein, respectively, by the use of which a coating process and a curing process are carried out in a sequential manner. Specifically, the first varnish, which is composed of a 10% by weight anisole solution containing polyvinylphenylsilsesquioxane (PVSQ) of a weight-average molecular weight of 150 k dissolved therein, and the second varnish, which is composed of a 15% by weight anisole solution containing PVSQ of a weight-average molecular weight of 150 k dissolved therein, are successively performed for 5 seconds at 100 rpm, for 10 seconds at 300 rpm, and for 60 seconds at 100 rpm, after which a thermal treatment is carried out at a temperature of 350 degrees for 1 hour or more, and then a slow cooling curing process is performed to form the silicone ladder polymer layer 32.

As a result, the silicone ladder polymer layer 32, in which the unevenness of deposition is effectively suppressed, can be obtained on a surface of the embedded oxide film 5 that faces an opening of the through hole 30. Here, note that the thickness of the silicone ladder polymer layer 32 can be controlled by optimizing the amount of dropping of a coating liquid when spin coating is carried out.

Subsequently, the entire rear surface of the support substrate 3G is subjected to a polishing process, whereby the silicone ladder polymer layer 32 formed on the rear surface of the support substrate 3G is removed, thus forming the rear surface electrode 18G comprising a metal deposition layer (e.g., a three-layer deposition of Ti/Ni/Au, etc.).

Then, a solder flux is applied to the rear surface electrode 18G by a spin coating method. Thereafter, as shown in FIG. 7, a predetermined amount of ball solder 35 comprising a lot of solder balls each having a diameter r is filled into the through hole 30, and is heated in a decompression furnace while the pressure therein is being reduced, whereby a void-free first solder 33 is formed.

Subsequently, the rear surface electrode 18G and the first solder 33 are soaked in a solder bath to form a second solder 34 with which the entire rear surface electrode 18G and the first solder 33 are covered.

The diameter r of each solder ball of the ball solder 35 used herein is defined with respect to the thickness Dsub of the support substrate 3G as r<0.1×Dsub, so the ball solder 35 of a fine size is used.

In such a dielectric isolation type semiconductor device 1G, the silicone ladder polymer layer 32 located right under the drain electrode 12 is supported by the void-free first solder 33, so a voltage drop is absorbed by the silicone ladder polymer layer 32, and the dielectric strength can be maintained high. In addition, the first solder 33, to which ultrasonic vibration is propagated during wire bonding, is of a void-free structure, and hence is able to avoid stress damage.

Moreover, assembling after a die bonding step can be carried out after a concave on the rear surface of the support substrate 3G due to the formation of the through hole 30 is eliminated by the first solder 33 filled therein, so a device structure can be obtained which gives no impediment to the wire bonding processing step.

Further, the ball solder 35, which serves to make flat the concave on the rear surface of the support substrate 3G, is used in which the diameter r of each solder ball is defined with respect to the thickness Dsub of the support substrate 3G as r<0.1×Dsub. Thus, it is possible to fill the concave with the solder that is void-free after melted.

Embodiment 6

Figure 8:
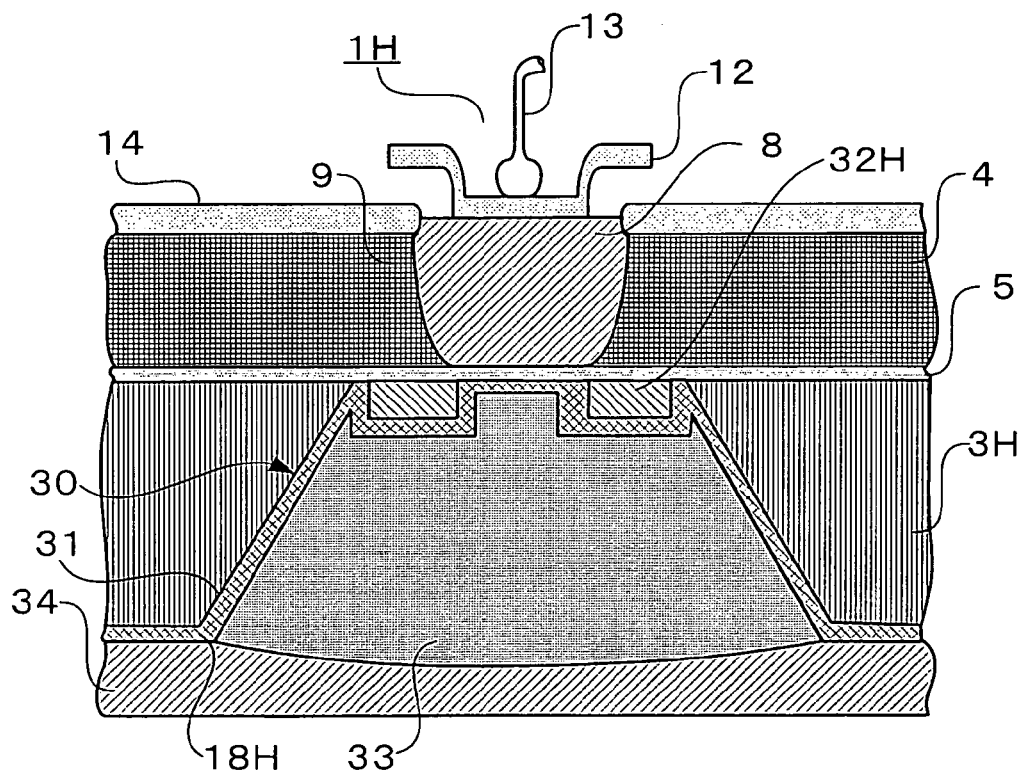
FIG. 8 is a cross sectional view of a dielectric isolation type semiconductor device according to a sixth embodiment of the present invention.
Figure 9:
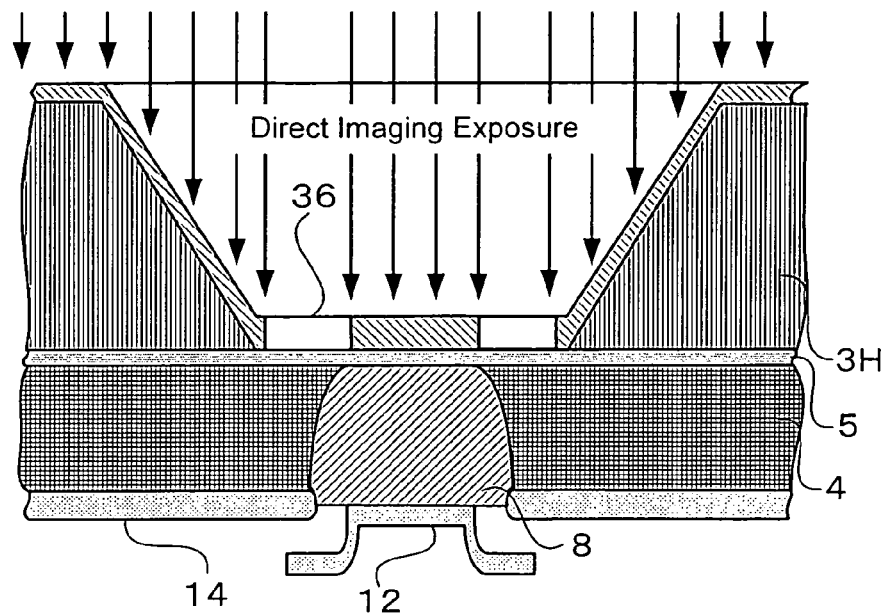
FIG. 9 is a view showing how to pattern a silicone ladder polymer layer in the sixth embodiment of the present invention.

FIG. 8 is a cross sectional view of a dielectric isolation type semiconductor device according to a sixth embodiment of the present invention, and FIG. 9 is a view how to pattern a silicone ladder polymer layer in the sixth embodiment of the present invention. The dielectric isolation type semiconductor device, generally designated at 1H, according to the fifth embodiment is different from the above-mentioned dielectric isolation type semiconductor device 1G according to the fifth embodiment in the positions of arrangement of an N-well region 8 formed in a semiconductor substrate 4 and a silicone ladder polymer layer 32H in the form of a first dielectric portion, as shown in FIG. 8, but the other construction of this sixth embodiment is similar to the fifth embodiment, and hence like components or parts are identified by like symbols while omitting a detailed explanation thereof. Also, the N-well region 8 of the semiconductor substrate 4 according to the sixth embodiment, is similar to the N-well region 8 according to the first embodiment, and hence an explanation thereof is omitted.

In addition, the silicone ladder polymer layer 32H according to the sixth embodiment is arranged at a position in one opening of the through hole 30 facing the embedded oxide film 5 except for an area of the embedded oxide film 5 located right under the N-well region 8H. Now, reference will be made to a method of forming the silicone ladder polymer layer 32H at such a selective position. The steps before and after this step are similar to those in the fifth embodiment. Similar to the fifth embodiment, the through hole 30 in the shape of a truncated quadrangular pyramid is formed in the support substrate 3H by means of anisotropic wet etching, and the surface of the embedded oxide film 5 that appears in the interior of the through hole 30 is primed.

Then, a silicone ladder polymer solution of photosensitive property is coated on the rear surface of the support substrate 3H, the side wall of the through hole 30, and the surface of the embedded oxide film 5 appearing in the interior of the through hole 30 by means of a spin coating method, a spray coating method, or an ink-jet method, and is subjected to a curing process, whereby a silicone ladder polymer film 36 is formed. Thereafter, as shown in FIG. 9, a part of the silicone ladder polymer film 36 to be removed is removed by a lithography method, e.g., it is subjected to direct imaging exposure, and is then developed to be selectively removed, so that the silicone ladder polymer layer 32H remains only at a prescribed position.

After this, the rear surface electrode 18H, the first solder 33 and the second solder 34 are formed in a manner similar to the fifth embodiment.

In such a dielectric isolation type semiconductor device 1H, the N-well region 8H reaches up to the embedded oxide film 5, so that the electric field strength in the n– region 9 in the vicinity of a boundary between the N-well region 8H and the n– region 9 is alleviated or reduced due to the arrangement of the silicone ladder polymer layer 32H. As a result, a high dielectric strength of the dielectric isolation type semiconductor device 1H can be maintained.

In addition, since the through hole 30 is filled with the first solder 33 that is void-free, the first solder 33 is not subjected to mechanical damage due to an ultrasonic vibration generated from a wire bonder, so the wire 13 can be connected with the drain electrode 12 in a reliable manner.

Moreover, the silicone ladder polymer layer 32H is arranged only at a position necessary to maintain a sufficient dielectric strength, and a portion of the embedded oxide film 5 other than that position is mechanically linked or connected to the first solder 33 through the rear surface electrode 18H, so when die bonding is made from the rear surface of the support substrate 3H, thermal resistance can be reduced.

Embodiment 7

Figure 10:
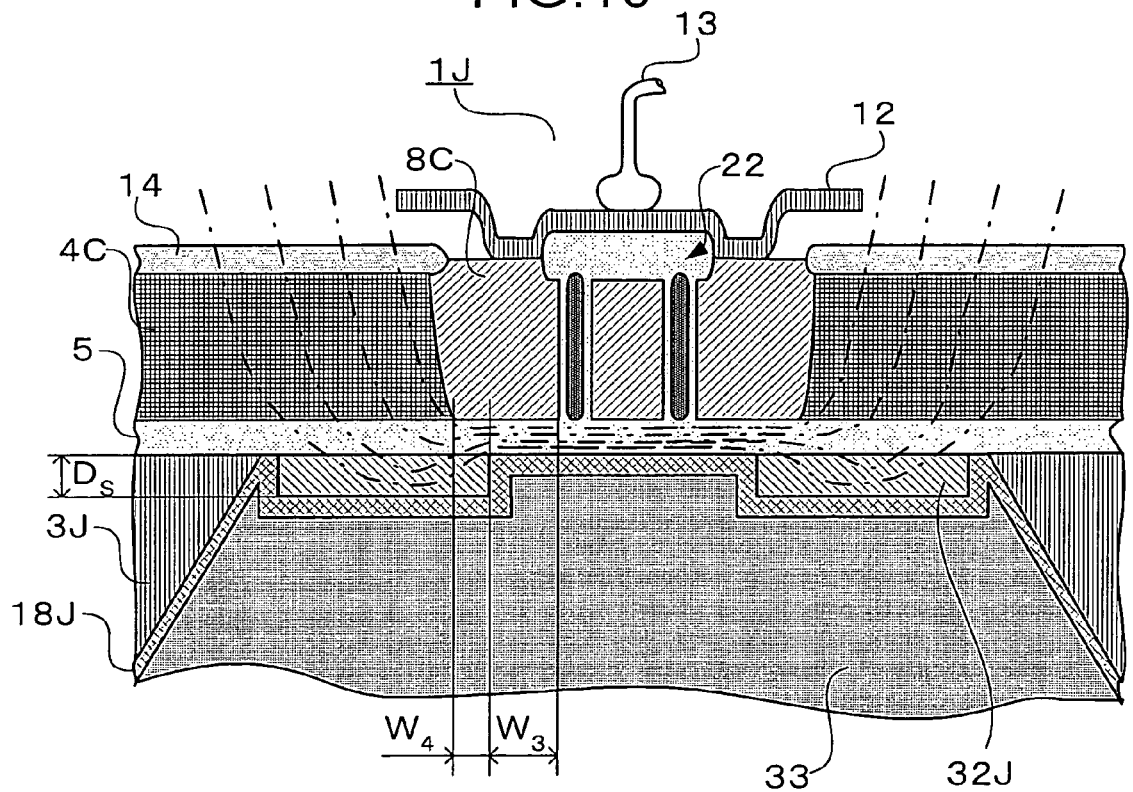
FIG. 10 is a cross sectional view of a dielectric isolation type semiconductor device according to a seventh embodiment of the present invention.

FIG. 10 is a cross sectional view of a dielectric isolation type semiconductor device according to a seventh embodiment of the present invention. The dielectric isolation type semiconductor device, generally designated at 1J, according to the seventh embodiment is different from the dielectric isolation type semiconductor device 1H according to the sixth embodiment in that a trench isolation region 22 is added to an N-well region 8C of a semiconductor substrate 4C, as shown in FIG. 10, but the other construction of this embodiment is similar to the sixth embodiment, and hence like components or parts are identified by like symbols while omitting a detailed explanation thereof.

Also, in the semiconductor substrate 4C according to the seventh embodiment, the N-well region 8C with the trench isolation region 22 disposed therein is formed similar to the third embodiment.

In such a dielectric isolation type semiconductor device 1J, the semiconductor substrate 4C according to the third embodiment and the support substrate 3H according to the sixth embodiment are combined with each other as the corresponding ones 4C and 3G, respectively, of this seventh embodiment, so their combined advantageous effects can be achieved.

That is, the trench isolation region 22, the rigidity of which is increased by the side wall oxide film 24, is formed in the lower portion of the drain electrode 12 to which the wire 13 is wire bonded, so the bonding strength of the wire 13 to the drain electrode 12 is improved.

In addition, the nearest distance $W_3$ between the trench isolation region 22 and the silicone ladder polymer layer 32J is larger than the thickness $D_S$ of the silicone ladder polymer layer 32J, so even if ultrasonic vibration is propagated below from a lower portion of the trench isolation region 22, it is possible to prevent the ultrasonic vibration from being irradiated or transmitted to the silicone ladder polymer layer 32J that is located outside the trench isolation region 22 by an angle of 45 degrees or more. Therefore, there will never be induced any mechanical defect such as a crack, etc., in the silicone ladder polymer layer 32J.

Moreover, the N-well region 8C reaches up to the embedded oxide film 5, so that the electric field strength in the n– region 9 in the vicinity of a boundary between the N-well region 8C and the n– region 9 is alleviated or reduced due to the arrangement of the silicone ladder polymer layer 32J. As a result, a high dielectric strength of the dielectric isolation type semiconductor device 1J can be maintained.

Further, the silicone ladder polymer layer 32J is arranged only at a position necessary to maintain a sufficient dielectric strength, and a portion of the embedded oxide film 5 other than that position is mechanically linked or connected to the first solder 33 through the rear surface electrode 18J, so when die bonding is made from the rear surface of the support substrate 3J, thermal resistance can be reduced.

Embodiment 8

Figure 11:
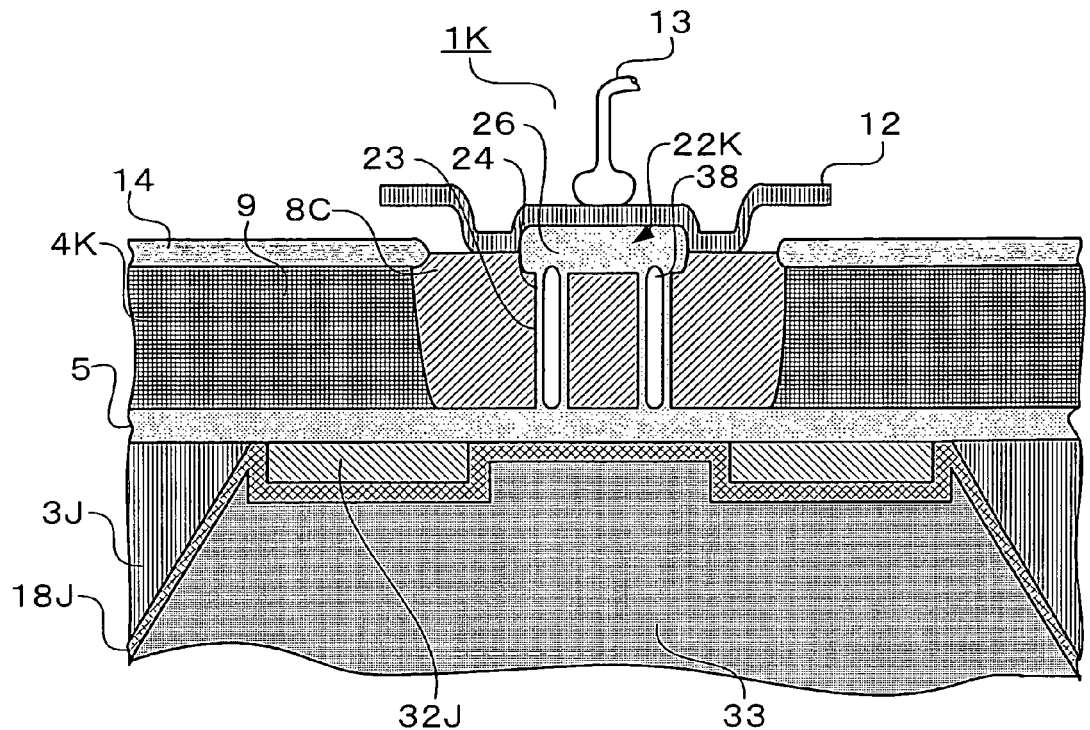
FIG. 11 is a cross sectional view of a dielectric isolation type semiconductor device according to an eighth embodiment of the present invention.

FIG. 11 is a cross sectional view of a dielectric isolation type semiconductor device according to an eighth embodiment of the present invention. The dielectric isolation type semiconductor device, generally designated at 1K, according to the eighth embodiment is different from the above-mentioned dielectric isolation type semiconductor device 1J according to the seventh embodiment in a trench isolation region 22K formed in a semiconductor substrate 4K, as shown in FIG. 11, but the other construction of this eighth embodiment is similar to the seventh embodiment, and hence like components or parts are identified by like symbols while omitting a detailed explanation thereof. The trench isolation region 22K according to the eighth embodiment includes a side wall oxide film 24 on a side wall of a trench groove 23, and a field oxide film 26 that covers the trench groove 23 on which the side wall oxide film 24 is formed. As a result, a cavity 38 is left in a part of the trench groove 23.

In such a dielectric isolation type semiconductor device 1K, the cavity 38 is left in the interior of the trench groove 23, so the propagation of ultrasonic vibration being transmitted to the field oxide film 26 is interrupted by the cavity 38. Accordingly, it is possible to avoid resultant damage that might be caused to the device structure of a MOSFET of the semiconductor substrate 4K.

Embodiment 9

Figure 12:
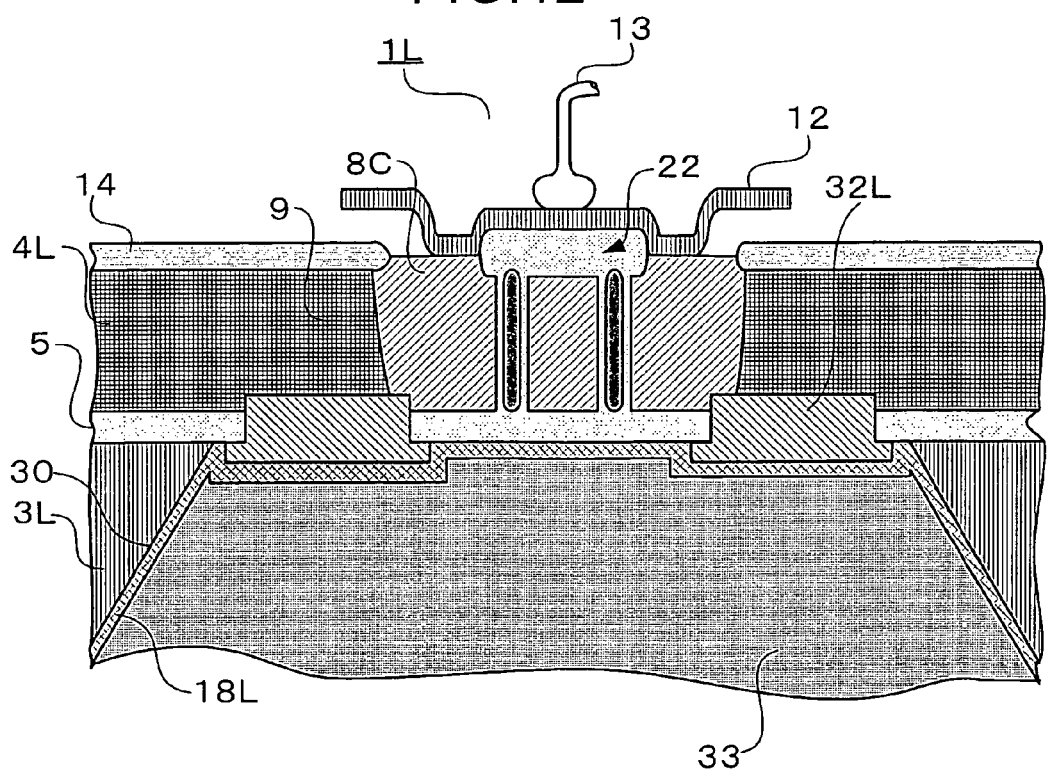
FIG. 12 is a cross sectional view of a dielectric isolation type semiconductor device according to a ninth embodiment of the present invention.
Figure 13:
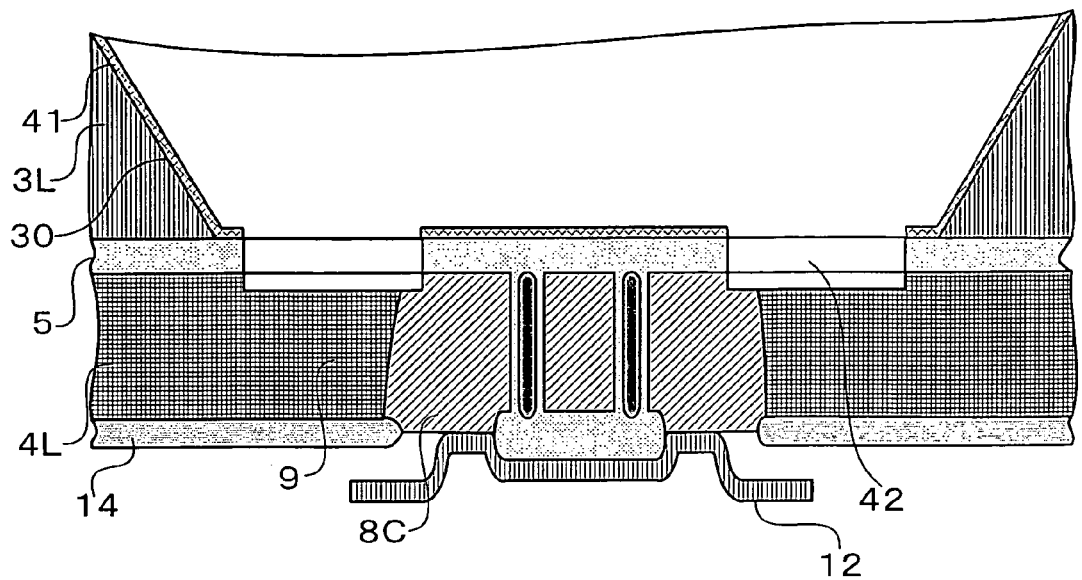
FIG. 13 is a cross sectional view of the dielectric isolation type semiconductor device showing how to etch a portion of an embedded oxide film and a semiconductor substrate according to the ninth embodiment of the present invention.
Figure 14:
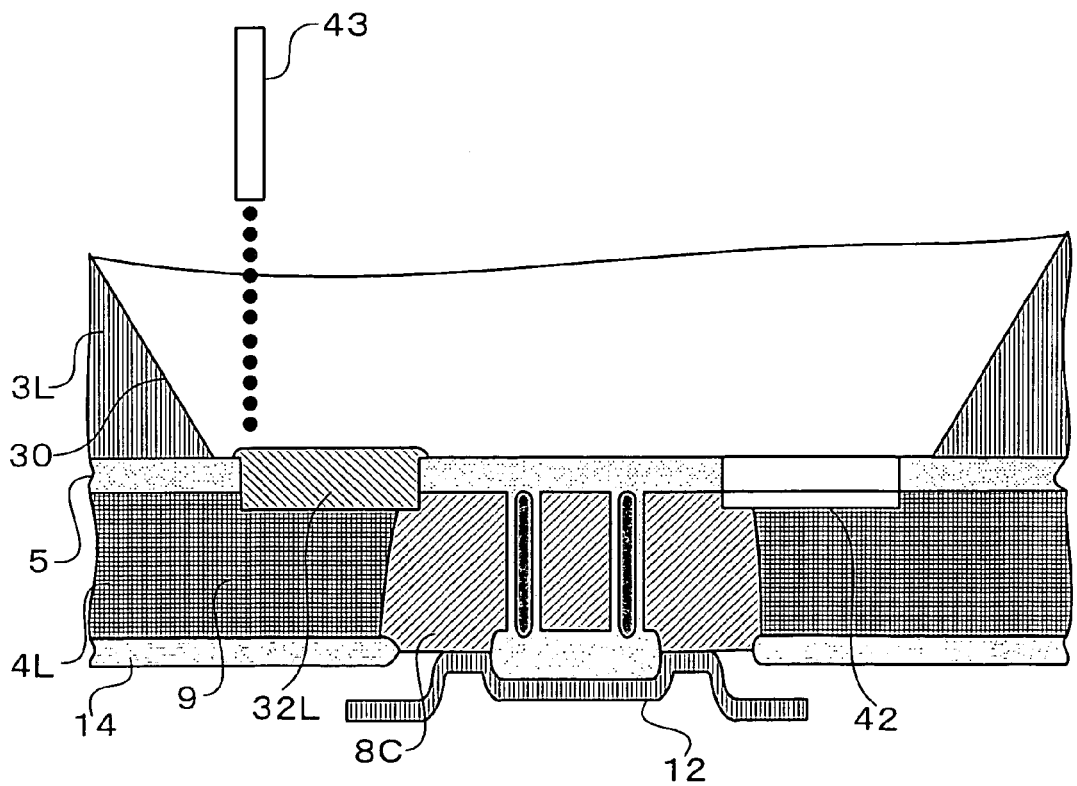
FIG. 14 is a cross sectional view of the dielectric isolation type semiconductor device showing how to form a silicone ladder polymer layer in a concave portion by means of an ink-jet method according to the ninth embodiment of the present invention.

FIG. 12 is a cross sectional view of a dielectric isolation type semiconductor device according to a ninth embodiment of the present invention. FIG. 13 is a cross sectional view of the dielectric isolation type semiconductor device showing how to etch a portion of an embedded oxide film and a semiconductor substrate according to the ninth embodiment of the present invention. FIG. 14 is a cross sectional view of the dielectric isolation type semiconductor device showing how to form a silicone ladder polymer layer in a concave portion by means of an ink-jet method according to the ninth embodiment of the present invention. The dielectric isolation type semiconductor device, generally designated at 1K, according to the fifth embodiment is different from the above-mentioned dielectric isolation type semiconductor device 1J according to the seventh embodiment in the position of arrangement of a silicone ladder polymer layer 32L in the form of a first dielectric portion, as shown in FIG. 12, but the other construction of this ninth embodiment is similar to the seventh embodiment, and hence like components or parts are identified by like symbols while omitting a detailed explanation thereof. The silicone ladder polymer layer 32L according to the ninth embodiment penetrates through the embedded oxide film 5 even into a part of the N-well region 8C and a part of the n− region 9, as shown in FIG. 12.

Now, reference will be made to a method of forming the silicone ladder polymer layer 32L.

The through hole 30 is formed by etching an area of the support substrate 3L located right under the drain electrode 12 of the semiconductor substrate 4L from the rear surface thereof by means of an anisotropic wet etching method until the embedded oxide film 5 appears.

A resist 41 is deposited, by means of a spray coating method, over the entire rear surface of the support substrate 3L including the embedded oxide film 5 that faces an opening of the through hole 30, after which a region of the resist 41 in which the silicone ladder polymer layer 32L is to be formed is exposed by direct imaging exposure, and is then developed to be removed so that the embedded oxide film 5 in the region where the silicone ladder polymer layer 32L is to be formed is made to appear.

Subsequently, the embedded oxide film 5 is etched to make appear in the region where the silicone ladder polymer layer 32L is to be formed, and the silicon of the N-well region 8C and the n− region 9 is then etched so as to form the concave portion 42, as shown in FIG. 13.

After that, primer processing is applied to the silicon by coating a primer liquid on the concave portion 42 and its surroundings by an ink-jet method.

Then, a silicone ladder polymer solution is injected from a nozzle 43 of an ink-jet system to fill in the concave portion 42 and at the same time to coat the surroundings of the concave portion 42, after which a curing process is carried out to form the silicone ladder polymer layer 32L. Thereafter, the rear surface electrode 18H, the first solder 33 and the second solder 34 are formed in a manner similar to the fifth embodiment, thus fabricating the dielectric isolation type semiconductor device 1L.

In such a dielectric isolation type semiconductor device 1L, the silicone ladder polymer layer 32L in the form of the first dielectric portion is formed directly without interposing the embedded oxide film 5 at the boundary between the N-well region 8C and the n− region 9, so the specific dielectric constant of the silicone ladder polymer layer 32L is smaller than the specific dielectric constant of the embedded oxide film 5 from the thermal oxide film, as a result of which the thickness of the silicone ladder polymer layer 32L can be made thinner, and hence the thermal resistance thereof can be reduced.

In addition, the silicone ladder polymer layer 32L can be selectively formed at a required position by performing the primer process and the coating of the silicone ladder polymer liquid according to the ink-jet method.

Embodiment 10

Figure 15:
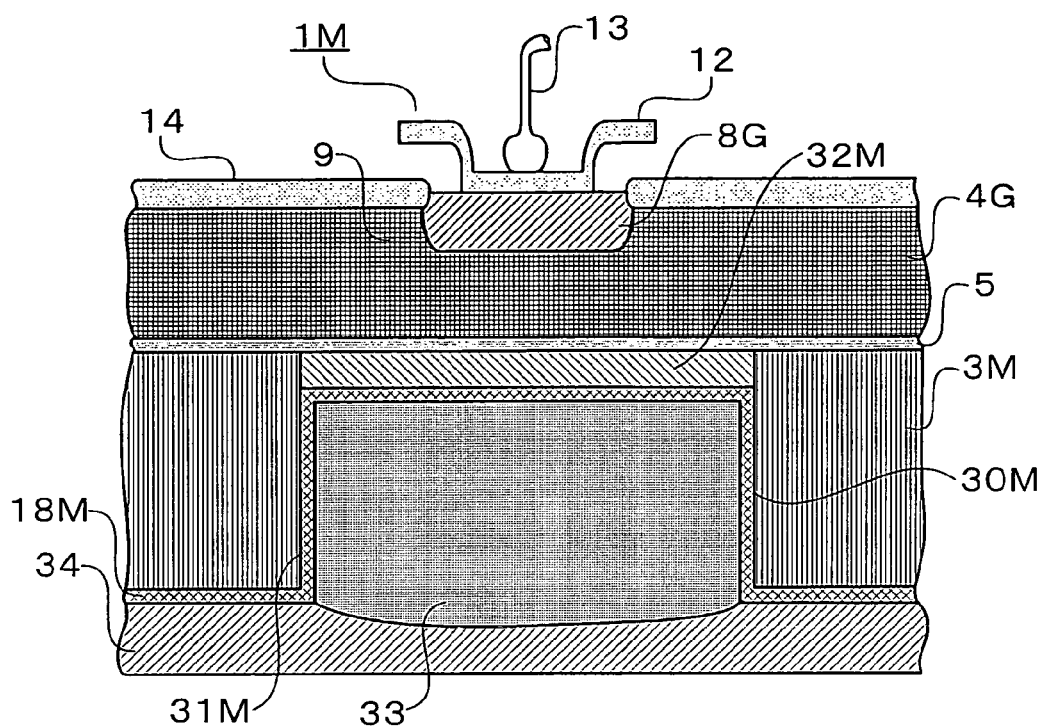
FIG. 15 is a cross sectional view of a dielectric isolation type semiconductor device according to a tenth embodiment of the present invention.
Figure 16:
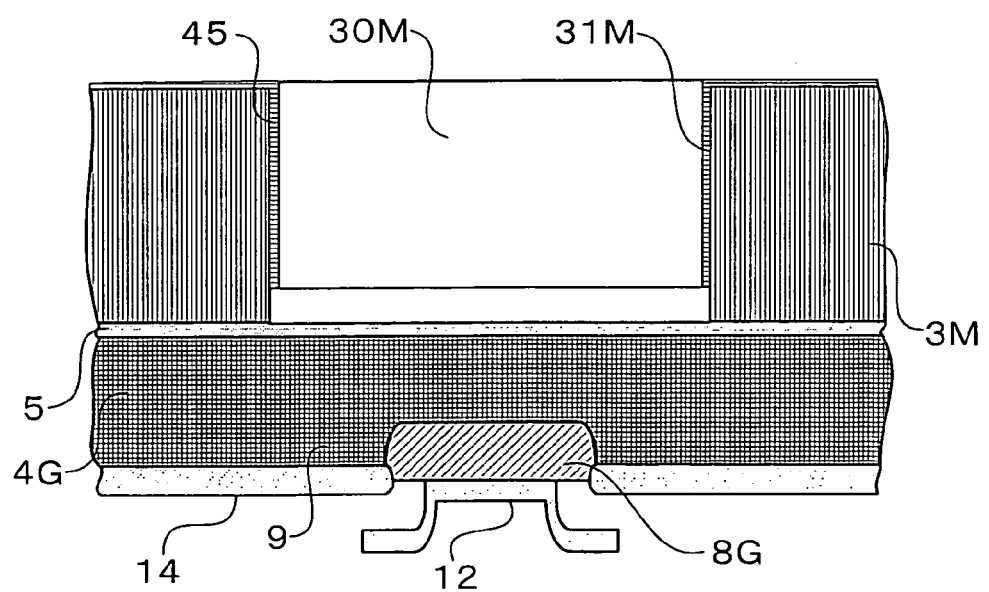
FIG. 16 is a cross sectional view of the dielectric isolation type semiconductor device showing how to form a columnar through hole in a support substrate by means of an anisotropic dry etching method according to the tenth embodiment of the present invention.
Figure 17:
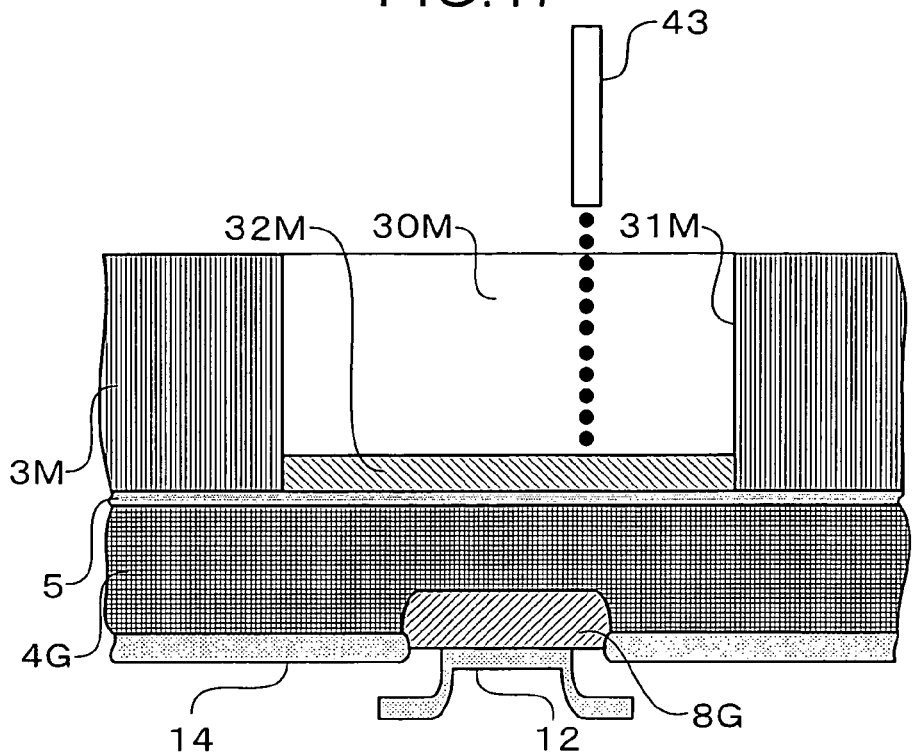
FIG. 17 is a cross sectional view of the dielectric isolation type semiconductor device showing how to form a silicone ladder polymer layer by means of an ink-jet method according to the tenth embodiment of the present invention.
Figure 18:
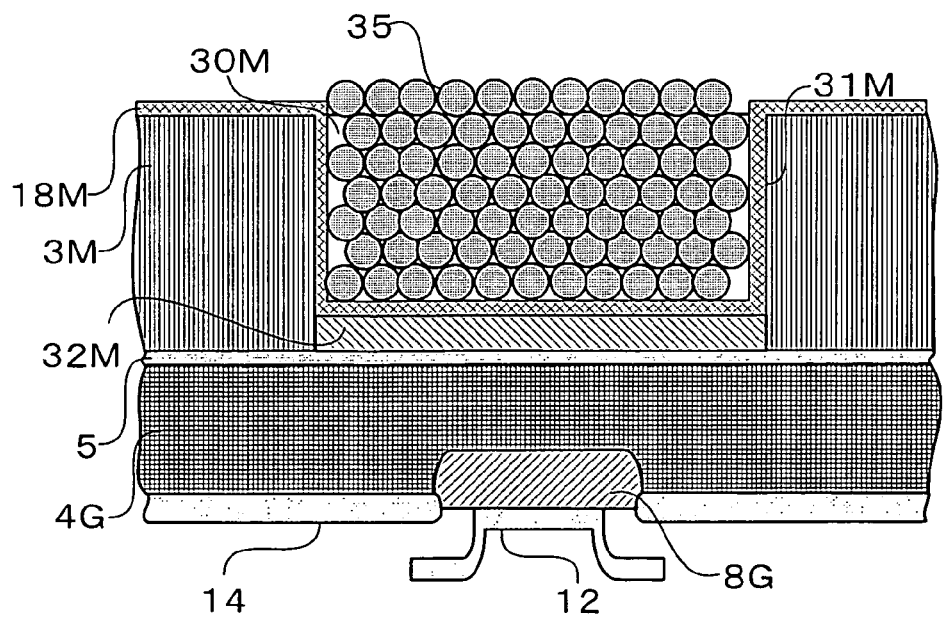
FIG. 18 is a view of the dielectric isolation type semiconductor device showing how to fill a ball solder into a through hole according to the tenth embodiment of the present invention.

FIG. 15 is a cross sectional view of a dielectric isolation type semiconductor device according to a tenth embodiment of the present invention. FIG. 16 is a cross sectional view of the dielectric isolation type semiconductor device showing how to form a columnar through hole in a support substrate by means of an anisotropic dry etching method according to the tenth embodiment of the present invention. FIG. 17 is a cross sectional view of the dielectric isolation type semiconductor device showing how to form a silicone ladder polymer layer by means of an ink-jet method according to the tenth embodiment of the present invention. FIG. 18 is a view of the dielectric isolation type semiconductor device showing how to fill a ball solder into a through hole according to the tenth embodiment of the present invention. The dielectric isolation type semiconductor device, generally designated at 1M, according to the tenth embodiment is different from the above-mentioned dielectric isolation type semiconductor device 1G according to the fifth embodiment in a through hole 30M formed in a support substrate 3M, but the other construction of this tenth embodiment is similar to the fifth embodiment, and hence like components or parts are identified by like symbols while omitting a detailed explanation thereof.

The through hole 30M formed in the support substrate 3M has its side wall 31M formed in parallel to the thickness direction of the support substrate 3M.

This through hole 30M can be formed by means of an anisotropic dry etching method using, for example, a Bosch process or the like. In the anisotropic dry etching method, as shown in FIG. 16, a resist 45 is coated on the side wall 31M every time the etching advances in the thickness direction of the support substrate 3M, whereby those portions of the side wall 31M which have already been etched are prevented from being further etched. As a result, the side wall 31M is formed so as to be in parallel to the thickness direction of the support substrate 3M.

Thus, the silicone ladder polymer layer 32M in the form of a first dielectric portion is formed over the entire surface of an embedded oxide film 5 that faces an opening of the through hole 30M with its side wall 31M formed in parallel to the thickness direction of the support substrate 3M. In addition, a rear surface electrode 18M is formed on the surface of the silicone ladder polymer layer 32M, the side wall 31M of the through hole 30M, and the rear surface of the support substrate 3M. The thickness of the silicone ladder polymer layer 32M is thinner than the thickness of the support substrate 3M, so there remains a recess in the through hole 30M, and the recess is filled with a ball solder, which is then melted by heating so that the recess is buried with a first solder 33, as in the fifth embodiment. Further, the first solder 33 and the rear surface electrode 18M on the rear surface of the support substrate 3M are covered with a second solder 34.

Next, reference will be made to the steps from the formation of the through hole 30M to the filling of the recess with the first solder 33.

The resist 45 is first coated on the rear surface of the support substrate 3M in such a manner that the columnar through hole 30M can be opened or formed in a region of the support substrate 3M right under a drain electrode 12 formed on a semiconductor substrate 4M, and a part of the resist 45 is then removed so that a part of the support substrate 3M in that region appears. Thereafter, the support substrate 3M is set in a dry etching apparatus, and is subjected to plasma etching. When the etching reaches a predetermined depth, a resist 45 is coated on the side wall 31M, as shown in FIG. 16, and the etching is then restarted. By repeating these processes, the etching is carried out until the embedded oxide film 5 is reached.

After that, a primer process is carried out so as to increase affinity between a silicone ladder polymer to be formed later and the embedded oxide film 5 by coating a primer liquid on the surface of the embedded oxide film 5 which appeared due to the etching.

Subsequently, as shown in FIG. 17, a silicone ladder polymer solution adjusted to a predetermined viscosity is injected from a nozzle 43 of a predetermined opening diameter so as to be coated on the surface of the embedded oxide film 5, and is then cured to solidify whereby the silicone ladder polymer layer 32M of a predetermined thickness is formed.

Then, the rear surface electrode 18M composed of a metal deposition layer (e.g., three-layer deposition of Ti/Ni/Au, etc.) is formed, from the rear surface side of the support substrate 3M, on the silicone ladder polymer layer 32M, the side wall 31M of the through hole 30M, and the rear surface of the support substrate 3M.

Thereafter, a solder flux is applied to the rear surface electrode 18M by an ink-jet method, and then, similar to the fifth embodiment, a predetermined amount of ball solder 35 comprising a lot of solder balls each having a diameter r is filled into the through hole 30M, as shown in FIG. 18, and is heated in a decompression furnace while the pressure therein is being reduced, whereby the void-free first solder 33 is formed.

Subsequently, the rear surface electrode 18M and the first solder 33 are soaked in a solder bath to form the second solder 34 with which the entire rear surface electrode 18M and the first solder 33 are covered. The through hole 30 according to the fifth embodiment has the side wall 31 formed at an angle of inclination or slope of 57 degrees with respect to the rear surface of the support substrate 3G by means of the anisotropic wet etching method, and hence takes the shape of a truncated quadrangular pyramid. Thus, in order for the through hole 30 to have its top opening that covers the region of the embedded oxide film 5 located right under the drain electrode 12, the bottom opening of the through hole 30 on the rear surface of the support substrate 3 needs to be wider. In contrast to this, however, according to this tenth embodiment, the through hole 30M, which is formed by dry etching while protecting the side wall 31M with the resist 45, is of a columnar shape, so the one opening of the through hole 30M containing the region of the embedded oxide film 5 located right under the drain electrode 12 is equal in area to the other opening thereof on the rear surface of the support substrate 3M.

Thus, in the dielectric isolation type semiconductor device 1M, the volume of the through hole 30M of the support substrate 3M is small, so reduction in the rigidity of the support substrate 3M due to the provision of the through hole 30M is accordingly small, and hence the wire 13 can be bonded to the drain electrode 12 by wire bonding while applying a large force to the drain electrode 12.

In addition, the columnar through hole 30M can be formed by adopting an anisotropic dry etching method.

Moreover, by adopting an ink-jet method, the silicone ladder polymer layer 32M can be formed only on the surface of the embedded oxide film 5 located at the bottom of the columnar through hole 30M.

Embodiment 11

Figure 19:
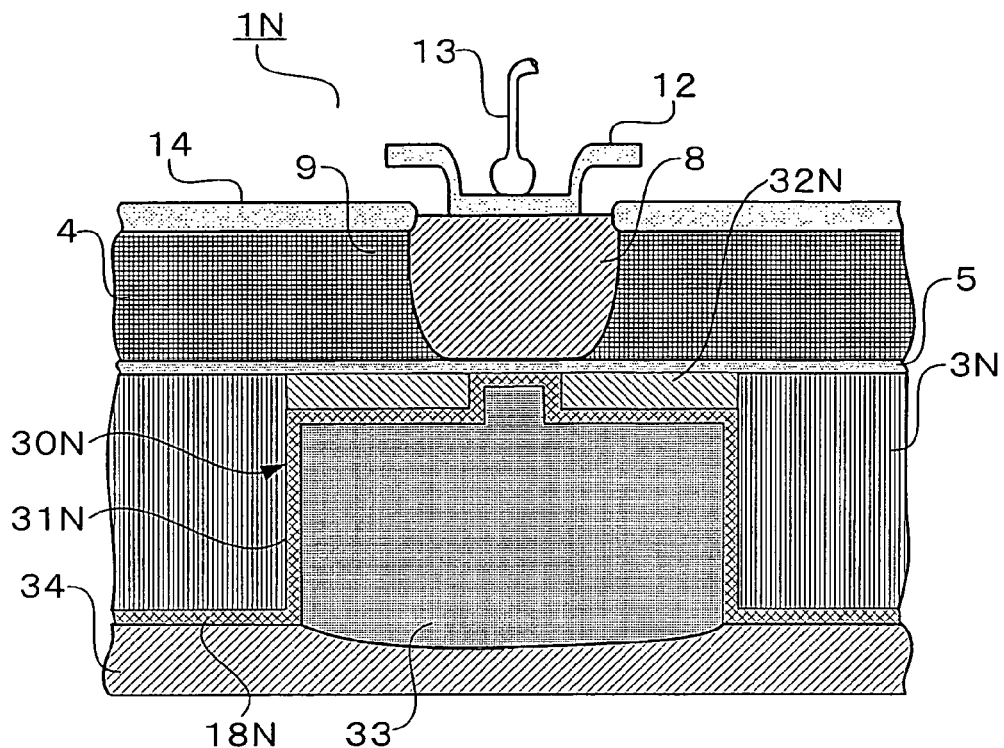
FIG. 19 is a cross sectional view of a dielectric isolation type semiconductor device according to an eleventh embodiment of the present invention.
Figure 20:
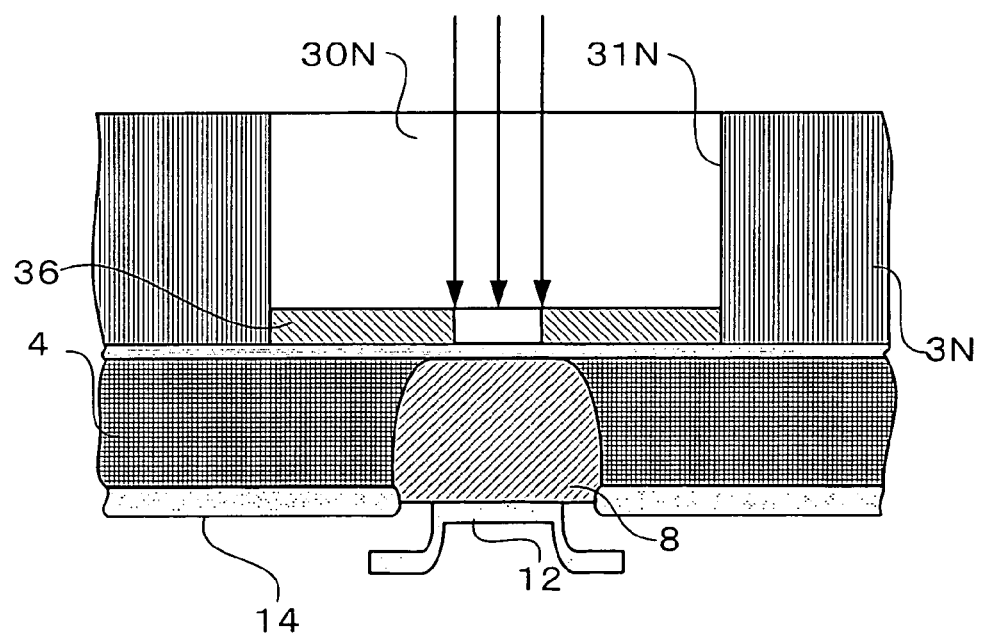
FIG. 20 is a cross sectional view of the dielectric isolation type semiconductor device showing how to etch a photosensitive silicone ladder polymer film thereby to form a silicone ladder polymer layer according to the eleventh embodiment of the present invention.

FIG. 19 is a cross sectional view of a dielectric isolation type semiconductor device according to an eleventh embodiment of the present invention. FIG. 20 is a cross sectional view of the dielectric isolation type semiconductor device showing how to etch a photosensitive silicone ladder polymer film thereby to form a silicone ladder polymer layer according to the eleventh embodiment of the present invention. The dielectric isolation type semiconductor device, generally designated at 1N, according to the eleventh embodiment is different from the above-mentioned dielectric isolation type semiconductor device 1H according to the sixth embodiment in a through hole 30N formed in a support substrate 3N, but the other construction of this eleventh embodiment is similar to the sixth embodiment, and hence like components or parts are identified by like symbols while omitting a detailed explanation thereof.

The through hole 30N formed in the support substrate 3N has its side wall 31N formed in parallel to the thickness direction of the support substrate 3N. This through hole 30N is formed by means of an anisotropic dry etching method, similar to the through hole 30M in the tenth embodiment.

Then, a silicone ladder polymer solution of photosensitive property is coated on the surface of an embedded oxide film 5 appearing in the interior of the through hole 30N by means of an ink-jet method, and is subjected to a curing process, whereby a silicone ladder polymer film 36 is formed.

Thereafter, as shown in FIG. 20, a part of the silicone ladder polymer film 36 to be removed is subjected to direct imaging exposure, and is then developed to be selectively removed, so that a silicone ladder polymer layer 32N remains only at a prescribed position.

After this, a rear surface electrode 18N, a first solder 33 and a second solder 34 are formed in a manner similar to the sixth embodiment.

Thus, in the dielectric isolation type semiconductor device 1N, the volume of the through hole 30N of the support substrate 3N is small, so reduction in the rigidity of the support substrate 3N due to the provision of the through hole 30N is accordingly small, and hence a wire 13 can be bonded to a drain electrode 12 by wire bonding while applying a large force to the drain electrode 12.

In addition, an N-well region 8 reaches up to an embedded oxide film 5, so that the electric field strength in an n− region 9 in the vicinity of a boundary between the N-well region 8 and the n− region 9 is alleviated or reduced due to the arrangement of the silicone ladder polymer layer 32N. As a result, a high dielectric strength of the dielectric isolation type semiconductor device 1N can be maintained.

Moreover, since the through hole 30N is filled with the first solder 33 that is void-free, the first solder 33 is not subjected to mechanical damage due to an ultrasonic vibration generated from a wire bonder, so the wire 13 can be connected with the drain electrode 12 in a reliable manner.

Further, the silicone ladder polymer layer 32N is arranged only at a position necessary to maintain a sufficient dielectric strength, and a portion of the embedded oxide film 5 other than that position is mechanically linked or connected to the first solder 33 through the rear surface electrode 18N, so when die bonding is made from the rear surface of the support substrate 3N, thermal resistance can be reduced.

Embodiment 12

Figure 21:
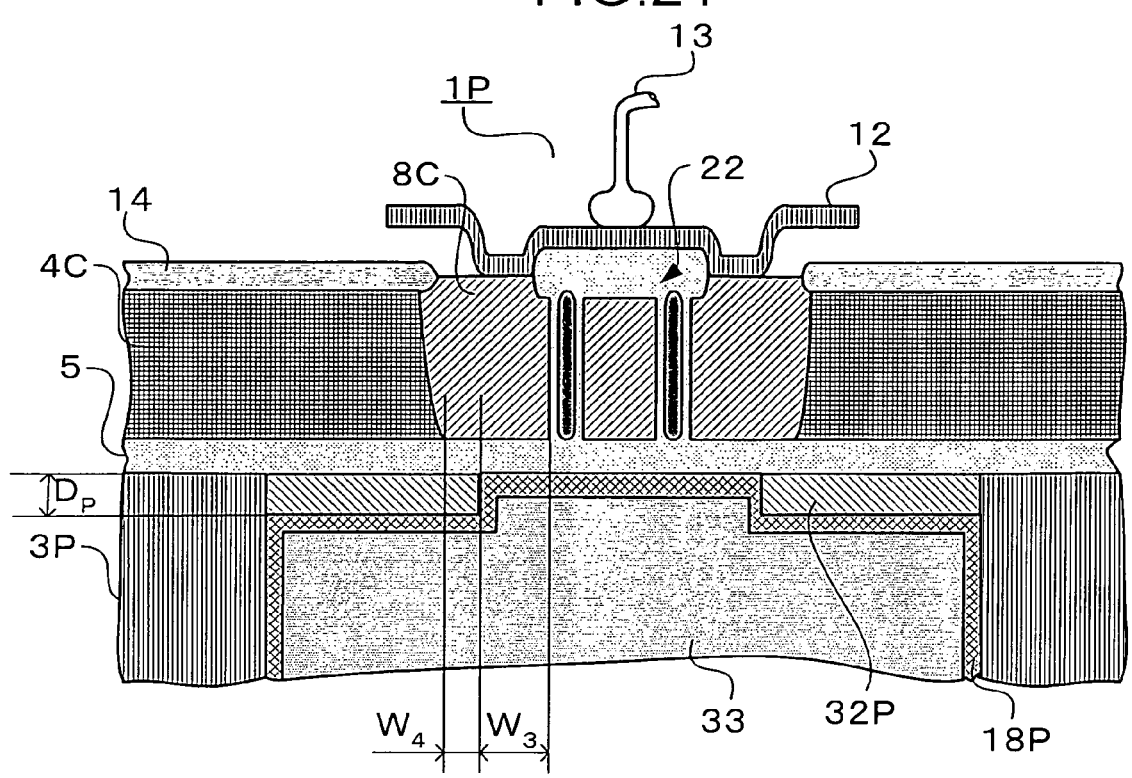
FIG. 21 is a cross sectional view of a dielectric isolation type semiconductor device according to a twelfth embodiment of the present invention.

FIG. 21 is a cross sectional view of a dielectric isolation type semiconductor device according to a twelfth embodiment of the present invention. The dielectric isolation type semiconductor device, generally designated at 1P, according to the twelfth embodiment is different from the above-mentioned dielectric isolation type semiconductor device 1N according to the eleventh embodiment in that a trench isolation region 22 is added to a semiconductor substrate 4C, but the other construction of this twelfth embodiment is similar to the eleventh embodiment, and hence like components or parts are identified by like symbols while omitting a detailed explanation thereof.

In such a dielectric isolation type semiconductor device 1P, the semiconductor substrate 4C according to the third embodiment and the support substrate 3H according to the sixth embodiment are combined with each other as the corresponding ones 4C and 3P, respectively, of this twelfth embodiment, so their combined advantageous effects can be achieved.

That is, a trench isolation region 22, the rigidity of which is increased by a side wall oxide film 24, is formed in a lower portion of a drain electrode 12 to which a wire 13 is wire bonded, so the bonding strength of the wire 13 to the drain electrode 12 is improved.

In addition, the nearest distance $W_3$ between the trench isolation region 22 and a silicone ladder polymer layer 32P is larger than the thickness $D_S$ of the silicone ladder polymer layer 32P, so even if ultrasonic vibration is propagated below from a lower portion of the trench isolation region 22, it is possible to prevent the ultrasonic vibration from being irradiated or transmitted to the silicone ladder polymer layer 32P that is located outside the trench isolation region 22 by an angle of 45 degrees or more. Therefore, there will never be induced any mechanical defect such as a crack, etc., in the silicone ladder polymer layer 32P.

Moreover, an N-well region 8C reaches up to an embedded oxide film 5, so that the electric field strength in an n– region 9 in the vicinity of a boundary between the N-well region 8C and the n– region 9 is alleviated or reduced due to the arrangement of the silicone ladder polymer layer 32P. As a result, a high dielectric strength of the dielectric isolation type semiconductor device 1P can be maintained.

Further, the silicone ladder polymer layer 32P is arranged only at a position necessary to maintain a sufficient dielectric strength, and a portion of the embedded oxide film 5 other than that position is mechanically linked or connected to a first solder 33 through a rear surface electrode 18P, so when die bonding is made from the rear surface of the support substrate 3P, thermal resistance can be reduced.

While the invention has been described in terms of preferred embodiments, those skilled in the art will recognize that the invention can be practiced with modifications within the spirit and scope of the appended claims.

What is claimed is:

1. A dielectric isolation type semiconductor device including a dielectric isolation type substrate, said dielectric isolation type substrate comprising:

a support substrate;

an embedded dielectric layer formed on an entire area of a first principal plane of said support substrate; and a semiconductor substrate of a first conductive type having a low impurity concentration being laminated on said support substrate through said embedded dielectric layer;

wherein said semiconductor substrate comprises:

a first semiconductor region of a first conductive type having a high impurity concentration that is selectively formed;

a second semiconductor region of a second conductive type having a high impurity concentration that is arranged so as to surround said first semiconductor region in a manner spaced a predetermined distance from an outer peripheral edge thereof;

a first main electrode that is joined to a surface of said first semiconductor region; and a second main electrode that is joined to a surface of said second semiconductor region;

wherein said dielectric isolation type semiconductor device comprises:

a first dielectric portion that is arranged adjacent to said embedded dielectric layer in a manner so as to surround a region of said support substrate that is superposed on said first semiconductor region in a direction of lamination thereof; and a wire that is connected with said first main electrode.

2. The dielectric isolation type semiconductor device as set forth in claim 1, wherein said first semiconductor region is in contact with said embedded dielectric layer.

3. The dielectric isolation type semiconductor device as set forth in claim 2, further comprising:

a first dielectric layer arranged in a region of said support substrate that is superposed in the direction of lamination of said first semiconductor region at a position spaced a predetermined distance in the direction of lamination from said embedded dielectric layer, said first dielectric layer being connected to said first dielectric portion.

* * * * *

UNITED STATES PATENT AND TRADEMARK OFFICE
CERTIFICATE OF CORRECTION

PATENT NO. : 7,485,943 B2
APPLICATION NO. : 11/408087
DATED : February 3, 2009
INVENTOR(S) : Hajime Akiyama It is certified that error appears in the above-identified patent and that said Letters Patent is hereby corrected as shown below:

Column 20, Line 53, add allowed Claims 4 - 7 omitted from the issued letters patent:

--4. The dielectric isolation type semiconductor device as set forth in claim 1, further comprising:
    a trench isolation region that is arranged in said first semiconductor region for separating said first semiconductor region into two concentric areas.

5. The dielectric isolation type semiconductor device as set forth in claim 4, wherein
    when said first semiconductor region, said first dielectric portion and said trench isolation region are projected on said embedded dielectric layer, a distance between said first dielectric portion and said trench isolation region exceeds the thickness in the direction of lamination of said first dielectric portion, and a width of overlap between said first semiconductor region and said first dielectric portion is equal to said distance between said first dielectric portion and said trench isolation region.

6. The dielectric isolation type semiconductor device as set forth in claim 4, wherein
    said trench isolation region has a cavity or a portion filled with polysilicon in an interior of the trench groove.

7. The dielectric isolation type semiconductor device as set forth in claim 1, wherein
    said first semiconductor region is spaced from said embedded dielectric layer; and
    said dielectric isolation type semiconductor device further comprises:
    a trench isolation region that separates the interior of said first semiconductor region and the interior of a region of said semiconductor substrate that is superposed on said first semiconductor region in the direction of lamination into two concentric areas; and

UNITED STATES PATENT AND TRADEMARK OFFICE
CERTIFICATE OF CORRECTION

PATENT NO. : 7,485,943 B2
APPLICATION NO. : 11/408087
DATED : February 3, 2009
INVENTOR(S) : Hajime Akiyama It is certified that error appears in the above-identified patent and that said Letters Patent is hereby corrected as shown below:

a third semiconductor region of a first conductive type having a high impurity concentration arranged adjacent to said trench isolation region so as to surround it and contact said first semiconductor region and said embedded dielectric layer.--

Signed and Sealed this

Twenty-ninth Day of December, 2009

David J. Kappos
*Director of the United States Patent and Trademark Office*